(12) United States Patent
Toriumi et al.

(10) Patent No.: US 7,955,994 B2
(45) Date of Patent: Jun. 7, 2011

(54) METHOD FOR MANUFACTURING SEMICONDUCTOR DEVICE, SEMICONDUCTOR DEVICE, AND ELECTRONIC APPLIANCE

(75) Inventors: Satoshi Toriumi, Kanagawa (JP); Noriyoshi Suzuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 200 days.

(21) Appl. No.: 12/243,164

(22) Filed: Oct. 1, 2008

(65) Prior Publication Data

US 2009/0102027 A1    Apr. 23, 2009

(30) Foreign Application Priority Data

Oct. 18, 2007 (JP) ................. 2007-271683

(51) Int. Cl.
*H01L 21/469* (2006.01)
(52) U.S. Cl. .. 438/786; 257/635; 257/637; 257/E21.292
(58) Field of Classification Search .................. 257/635, 257/637, E21.292; 438/786
See application file for complete search history.

(56) References Cited

U.S. PATENT DOCUMENTS

| | | | |
|---|---|---|---|
| 5,429,995 A | 7/1995 | Nishiyama et al. | |
| 5,641,581 A | 6/1997 | Nishiyama et al. | |
| 6,034,418 A | 3/2000 | Matsuura | |
| 6,157,083 A | 12/2000 | Usami et al. | |
| 6,211,096 B1 * | 4/2001 | Allman et al. | 438/787 |
| 6,228,778 B1 | 5/2001 | Matsuura | |
| 6,528,410 B1 | 3/2003 | Usami et al. | |
| 6,768,260 B2 * | 7/2004 | Fukunaga et al. | 313/506 |
| 6,835,669 B2 * | 12/2004 | Oku et al. | 438/758 |

FOREIGN PATENT DOCUMENTS

| | | |
|---|---|---|
| JP | 07-074245 | 3/1995 |
| JP | 08-236519 | 9/1996 |
| JP | 09-139428 | 5/1997 |
| JP | 09-275103 | 10/1997 |
| JP | 10-056009 | 2/1998 |
| JP | 11-087340 | 3/1999 |

\* cited by examiner

*Primary Examiner* — Matthew C Landau
*Assistant Examiner* — Vicki B Booker
(74) *Attorney, Agent, or Firm* — Nixon Peabody LLP; Jeffrey L. Costellia

(57) ABSTRACT

An object of the present invention is to provide a semiconductor device including an insulating layer with a high dielectric strength voltage, a low dielectric constant, and low hygroscopicity. Another object of the present invention is to provide an electronic appliance with high performance and high reliability, which uses the semiconductor device. An insulator containing nitrogen, such as silicon oxynitride or silicon nitride oxide, and an insulator containing nitrogen and fluorine, such as silicon oxynitride added with fluorine or silicon nitride oxide added with fluorine, are alternately deposited so that an insulating layer is formed. By sandwiching an insulator containing nitrogen and fluorine between insulators containing nitrogen, the insulator containing nitrogen and fluorine can be prevented from absorbing moisture and thus a dielectric strength voltage can be increased. Further, an insulator contains fluorine so that a dielectric constant can be reduced.

16 Claims, 22 Drawing Sheets

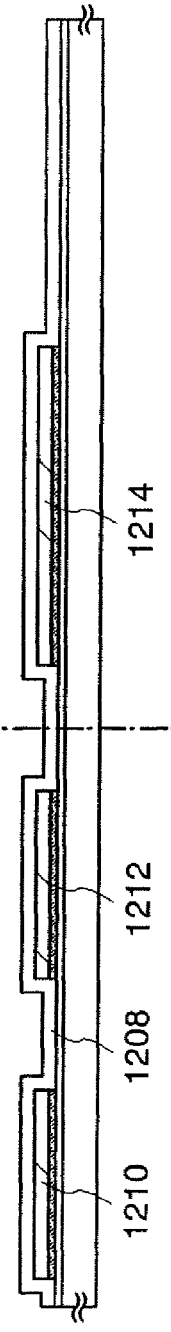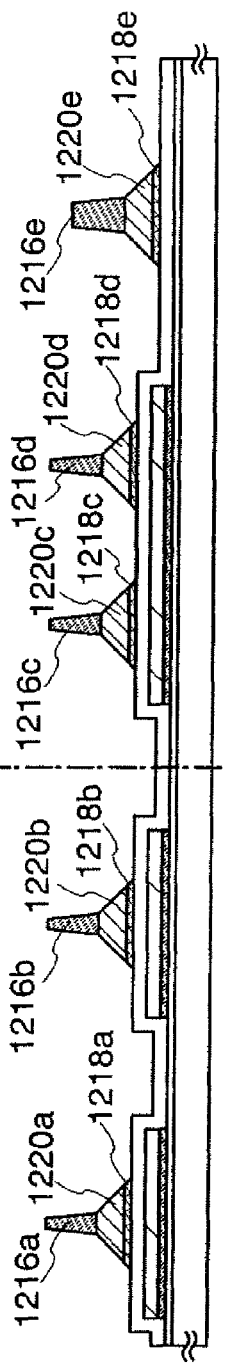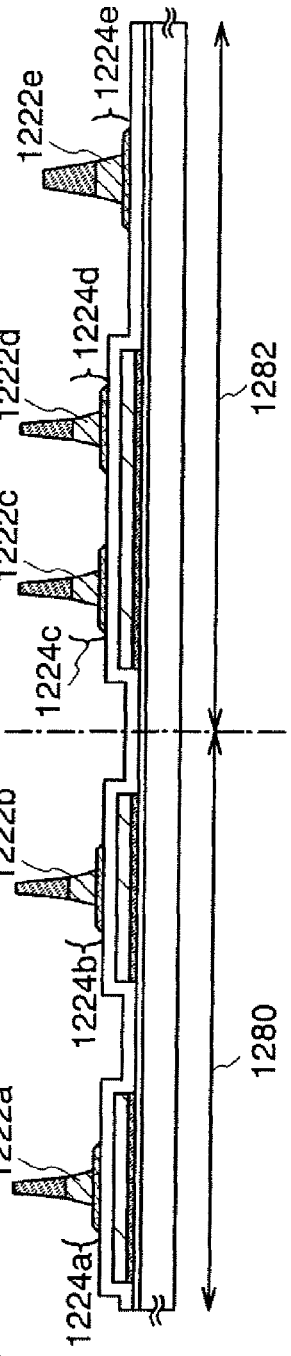

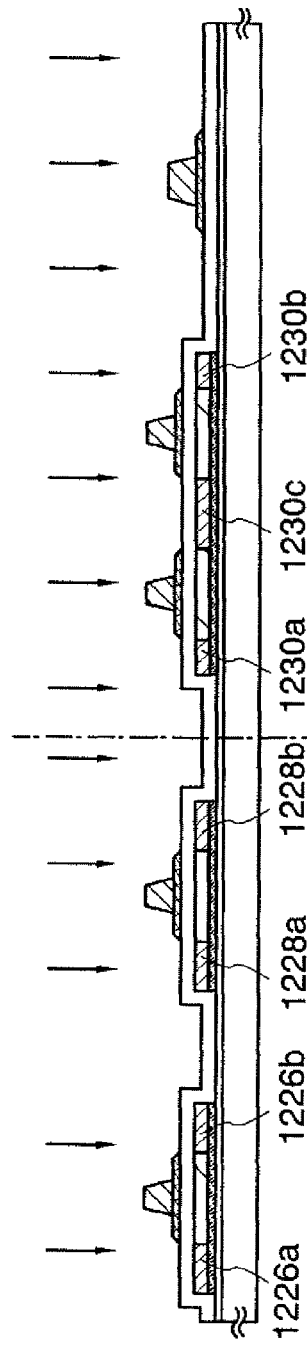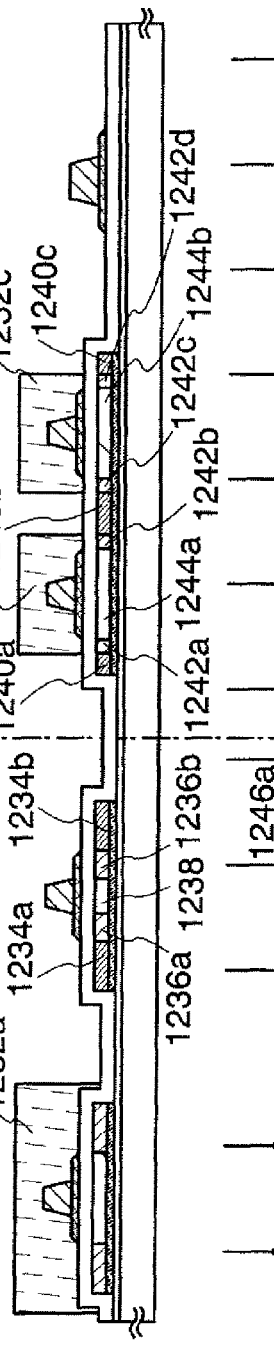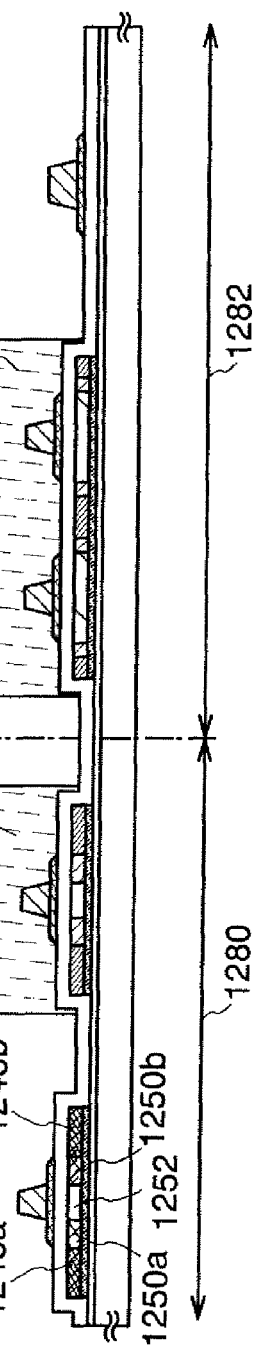

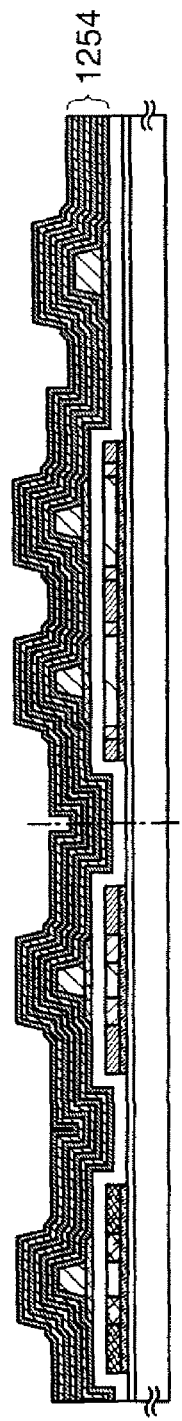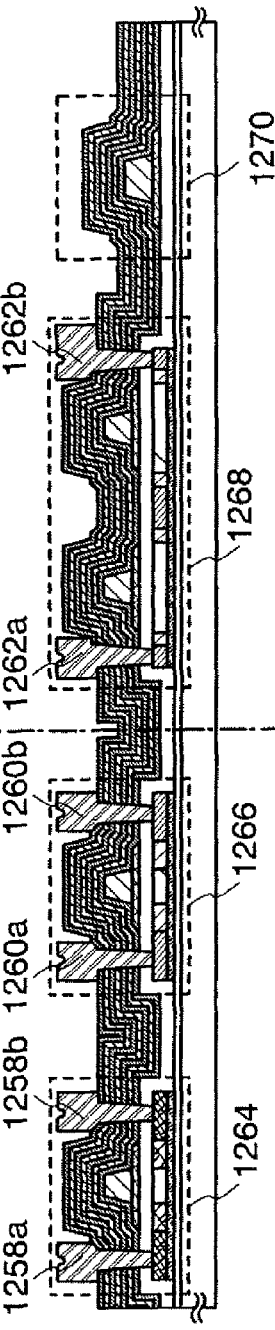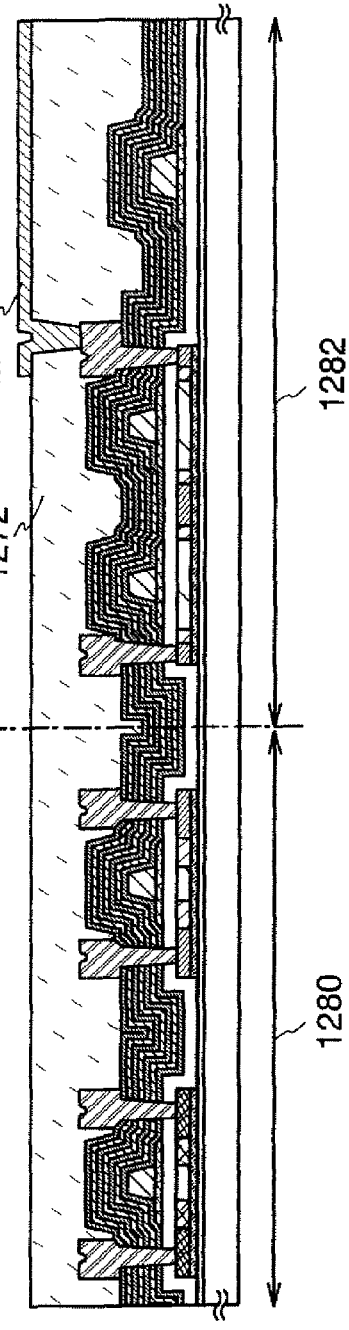
FIG. 14A
FIG. 14B
FIG. 14C

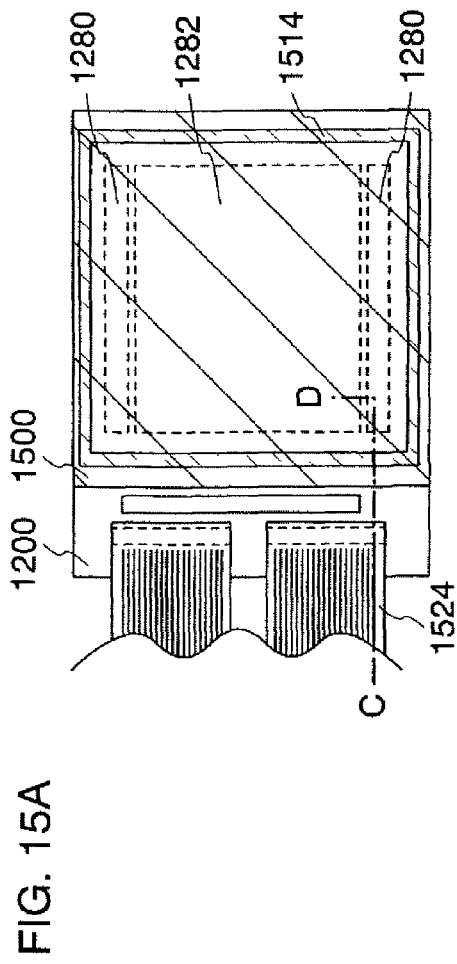
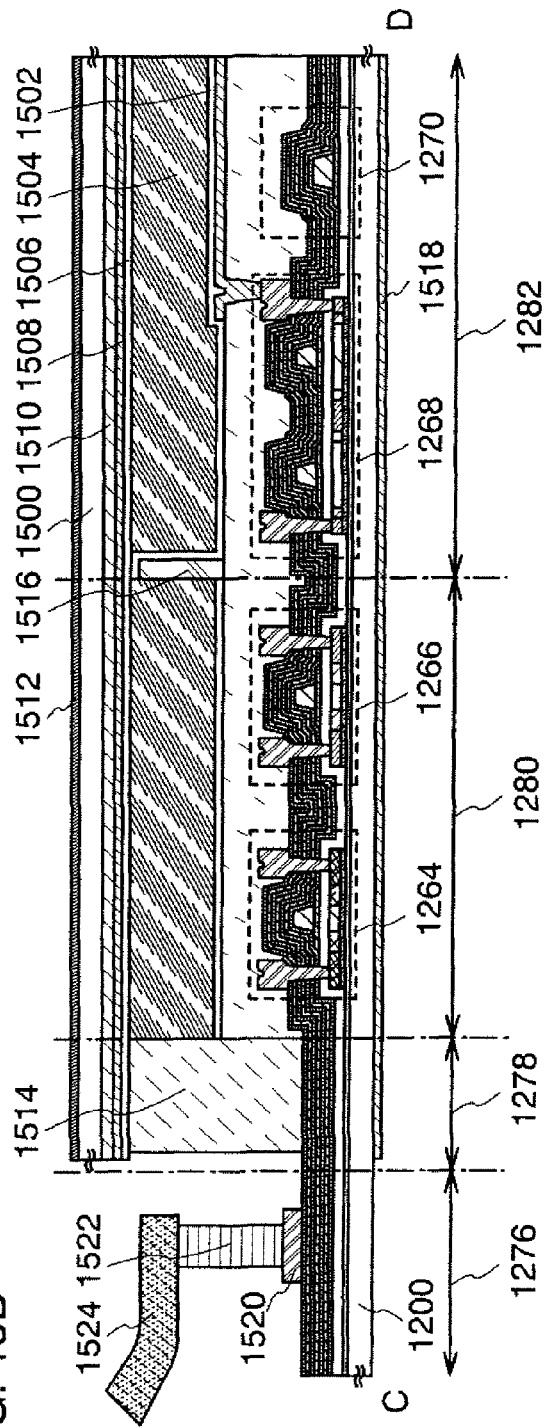
FIG. 15A
FIG. 15B

| | INSULATING LAYER FORMED OF SILICON OXYNITRIDE | INSULATING LAYER FORMED OF SILICON OXYNITRIDE CONTAINING FLUORINE | INSULATING LAYER INCLUDING 9 REGIONS |
|---|---|---|---|
| INITIAL THICKNESS (nm) | 102.6 | 115.5 | 112.9 |
| THICKNESS AFTER ACCELERATED TEST (nm) | 108.2 | 123.2 | 116.3 |
| THICKNESS VARIATION | 5.6 | 7.7 | 3.4 |
| INITIAL REFRACTIVE INDEX | 1.506 | 1.505 | 1.47 |
| REFRACTIVE INDEX AFTER ACCELERATED TEST | 1.458 | 1.455 | 1.463 |
| REFRACTIVE INDEX VARIATION | 0.048 | 0.05 | 0.007 |

METHOD FOR MANUFACTURING SEMICONDUCTOR DEVICE, SEMICONDUCTOR DEVICE, AND ELECTRONIC APPLIANCE

BACKGROUND OF THE INVENTION

1. Field of the Invention

The present invention relates to a method for manufacturing semiconductor devices, semiconductor devices, and electronic appliances.

2. Description of the Related Art

Heretofore, various insulating materials have been used for semiconductor devices such as display devices. In semiconductor devices, an insulating material is used so as to serve as insulating layers in many cases, and the insulating layers have a wide variety of functions. For example, for a gate insulating layer of a transistor, a function of ensuring insulation between a gate electrode and a semiconductor layer is required. Further, for an interlayer insulating layer, a function of keeping planarity of a surface may be required in addition to a function of ensuring insulation between layers. Further, for an insulating layer serving as a passivation film, a function of preventing an impurity from intruding a semiconductor layer is required.

As described above, since various functions are required for insulating layers, characteristics significantly differ between insulating layers. For example, it can be said that in the case of using an insulating layer as an interlayer insulating layer, a low dielectric constant and low hygroscopicity are required as well as a high dielectric strength voltage. A low dielectric constant is required here for enabling higher speed operation by reduction in capacitance between wirings. Further, low hygroscopicity is required for holding reliability of a semiconductor device by preventing expansion of the insulating layer due to moisture absorption to ensure planarity of a surface, thereof.

For such an insulating layer, an inorganic material containing silicon is used in many cases. For example, an interlayer insulating layer can be formed using silicon oxide which is an inorganic material containing silicon. For the above reason, a low dielectric constant is required for an interlayer insulating layer, and as one of methods for realizing a low dielectric constant, proposed is a method for adding fluorine to an insulating layer (for example, Patent Document 1: Japanese Published Patent Application No. H8-236519).

As described above, by adding fluorine to an insulating layer, a dielectric constant can be reduced, but there occurs a problem that the insulating layer absorbs moisture more easily than an insulating layer to which fluorine is not added. Further, when fluorine and water in the insulating layer react with each other, there also occurs a problem that the insulating layer is porous and thus a dielectric strength voltage and mechanical strength are reduced.

SUMMARY OF THE INVENTION

In view of the above problems, an object of the present invention is to provide a semiconductor device including an insulating layer with a high dielectric strength voltage, a low dielectric constant, and low hygroscopicity. Another object of the present invention is to provide an electronic appliance with high performance and high reliability, which uses the semiconductor device.

According to the present invention, an insulator containing nitrogen, such as silicon oxynitride or silicon nitride oxide, and an insulator containing nitrogen and fluorine, such as silicon oxynitride added with fluorine or silicon nitride oxide added with fluorine, are alternately deposited a plurality of times so that an insulating layer is formed to include a plurality of first regions containing nitrogen and a plurality of second regions containing nitrogen and fluorine which are alternately provided. By sandwiching an insulator containing nitrogen and fluorine between insulators containing nitrogen, the insulator containing nitrogen and fluorine can be prevented from absorbing moisture and thus a dielectric strength voltage can be increased. Further, an insulator contains fluorine so that a dielectric constant can be reduced.

An aspect of the present invention is a method for manufacturing a semiconductor device including a semiconductor layer over a substrate, wherein deposition of a first insulator containing nitrogen and deposition of a second insulator containing nitrogen and fluorine are repeated a plurality of times so that an insulating layer alternately including a first region containing nitrogen and a second region containing nitrogen and fluorine is formed over the semiconductor layer. Here, "a plurality of times" refers to two or more times. That is, an insulating layer including four or more regions is formed. In addition, "the insulating layer over the semiconductor layer" means that the insulating layer is above the semiconductor layer and the insulating layer is not necessarily in contact with the semiconductor layer. It is needless to say that the insulating layer may be formed below the semiconductor layer.

In the method for manufacturing a semiconductor device, it is preferred that the first insulator be deposited by a plasma CVD method using a gas containing nitrogen as a source gas and the second insulator be deposited by a plasma CVD method using a gas containing nitrogen and a gas containing fluorine as source gases.

In the method for manufacturing a semiconductor device, it is also preferred that the gas containing fluorine be selectively added (or not added) to the gas containing nitrogen so that the first insulator and the second insulator are successively deposited in the same apparatus.

Another aspect of the present invention is a method for manufacturing a semiconductor device including a semiconductor layer over a substrate, wherein deposition of a first insulator containing nitrogen and deposition of a second insulator containing nitrogen and fluorine are repeated a plurality of times so that an insulating layer alternately including a first region containing nitrogen and a second region containing nitrogen and fluorine is deposited over the semiconductor layer, the first insulator is formed by a plasma CVD method using a gas containing nitrogen and silicon as a source gas, the second insulator is deposited by a plasma CVD method using, as a source gas, a gas obtained by adding fluorine to the source gas used for deposition of the first insulator, and the first insulator and the second insulator are successively deposited in the same apparatus.

In the method for manufacturing a semiconductor device, the first insulator can be silicon oxynitride or silicon nitride oxide and the second insulator can be silicon oxynitride containing fluorine or silicon nitride oxide containing fluorine.

Note that in the method for manufacturing a semiconductor device, an uppermost surface of the insulating layer is preferably formed of the first insulator. The first insulators are preferably formed so that the thicknesses thereof are increased from the lower part to the upper part of the insulating layer. The second insulators are preferably formed so that the thicknesses thereof are reduced from the lower part to the upper part of the insulating layer.

Further, the concentration of fluorine in the second region is preferably from $5 \times 10^{18}$ to $1 \times 10^{21}$ atoms/cm$^3$, inclusive. The insulating layer may be processed using dry etching.

Another aspect of the present invention is a semiconductor device including a semiconductor layer over a substrate and an insulating layer over the semiconductor layer. The insulating layer alternately includes a plurality of first regions each formed of a first insulator containing nitrogen and a plurality of second regions each formed of a second insulator containing nitrogen and fluorine. Here, "plurality" means that the insulating layer includes two or more first regions and two or more second regions (that is, the insulating layer includes four or more regions).

In the semiconductor device, the first insulator can be silicon oxynitride or silicon nitride oxide and the second insulator can be silicon oxynitride containing fluorine or silicon nitride oxide containing fluorine.

Note that in the semiconductor device, an uppermost surface of the insulating layer is preferably formed of the first insulator. The first insulators are preferably formed so that the thicknesses thereof are increased from the lower layer to the upper layer of the insulating layer. The second insulators are preferably formed so that the thicknesses thereof are reduced from the lower layer to the upper layer of the insulating layer.

Here, in the profile of element concentration of the insulating layer in a depth direction, the concentration of fluorine has the peak in the second region and the concentration of nitrogen (or the concentration of silicon) does not have the peak in the second region. In addition, the concentration of nitrogen (or the concentration of silicon) in the first region is equal to the concentration of nitrogen (or the concentration of silicon) in the second region. Here, "equal" means that the concentrations are substantially equal to each other and they are not necessarily completely equal to each other. Further, "substantially" means that changes in concentration within the range of error in measurement are allowed.

Further, the concentration of fluorine in the second region is preferably from $5\times10^{18}$ to $1\times10^{21}$ atoms/cm$^3$, inclusive.

By using the above semiconductor device, a variety of electronic appliances can be provided.

Note that in the present invention, a semiconductor device refers to a general semiconductor device including a semiconductor layer, such as a display device typified by a liquid crystal display device or an electroluminescent display device; a wireless tag called an RFID (radio frequency identification) tag, an RF tag, an RF chip, a wireless processor, a wireless memory, an IC (integrated circuit) tag, an IC label, an electronic tag, an electronic chip, or the like; a microprocessor typified by a central processing unit (CPU); or an integrated circuit.

In the present invention, by providing an insulator containing nitrogen in an insulating layer, an insulator containing fluorine can be prevented from absorbing moisture. Accordingly, variation in thickness of the insulating layer can be prevented and thus reduction in a dielectric strength voltage and mechanical strength can be prevented. Further, an insulator contains fluorine so that an insulating layer with a low dielectric constant can be obtained.

BRIEF DESCRIPTION OF THE DRAWINGS

FIGS. 12A to 12D are views illustrating an example of a process for forming a semiconductor device.

FIGS. 13A to 13C are views illustrating an example of a process for forming a semiconductor device.

FIGS. 14A to 14C are views illustrating an example of a process for forming a semiconductor device.

FIGS. 15A and 15B are a plan view and a cross sectional view of a semiconductor device.

FIG. 22 shows parameters of insulating layers before and after an accelerated test.

DETAILED DESCRIPTION OF THE INVENTION

Figure 1A:
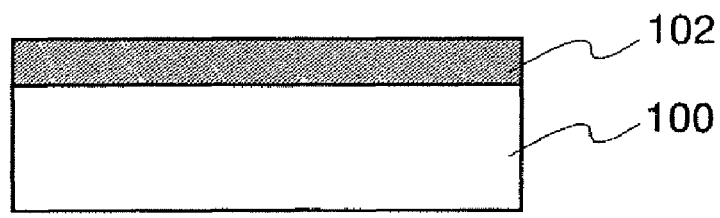
FIGS. 1A to 1C are views illustrating a process for forming an insulating layer.

The embodiment modes and embodiment of the present invention will be described with reference to the accompanying drawings. However, the present invention can be carried out in many different modes, and it will be easily understood by those skilled in the art that various changes and modifications can be made to the modes and their details without departing from the spirit and scope of the present invention. Therefore, the present invention should not be construed as being limited to the description in the following embodiment modes and embodiment. Note that like reference numerals refer to like parts throughout the drawings in the structure of the present invention described below.

Embodiment Mode 1

In this embodiment mode, an insulating layer according to the present invention will be described with reference to FIGS. 1A to 1C, FIG. 2, FIGS. 3A to 3C, FIGS. 4A and 4B, FIGS. 5A and 5B, and FIGS. 6A and 6B.

First, an insulator 102 containing nitrogen is formed on a surface of an object to be processed 100 (also referred to as a surface to be processed) (see FIG. 1A). The object to be processed 100 is not particularly limited and, for example, may be a substrate used for manufacturing a semiconductor device. As the substrate, a non-alkali glass substrate such as a barium borosilicate glass substrate, an aluminoborosilicate glass substrate, or an aluminosilicate glass substrate, a ceramic substrate, or the like can be used. Alternatively, a plastic substrate or the like may be used as long as it resists heat. Still alternatively, a metal substrate such as a stainless steel alloy, a single crystal semiconductor substrate, a quartz substrate, or the like may be used. The size of the substrate is not particularly limited and any of the following sizes can be used: 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, and the like.

It is needless to say that the object to be processed 100 is not limited to a substrate and may be an insulating layer, a semiconductor layer, or a conductive layer forming a wiring or the like. That is, the insulating layer according to the present invention may be formed on any surface.

As the insulator 102 containing nitrogen, for example, silicon oxynitride, silicon nitride oxide, or the like may be formed by a CVD method, a sputtering method, or the like.

Here, an oxynitride refers to a substance containing more oxygen than nitrogen. For example, silicon oxynitride refers to a substance containing oxygen, nitrogen, silicon, and hydrogen at concentrations ranging from 50 to 70 atoms %, from 0.5 to 15 atoms %, from 25 to 35 atoms %, and from 0.1 to 10 atoms %, respectively. Meanwhile, nitride oxide refers to a substance containing more nitrogen than oxygen. For example, silicon nitride oxide refers to a substance containing oxygen, nitrogen, silicon, and hydrogen at concentrations ranging from 5 to 30 atoms %, from 20 to 55 atoms %, from 25 to 35 atoms %, and from 10 to 30 atoms %, respectively. It is to be noted that the ranges given above are obtained in the case where measurements are performed using Rutherford backscattering spectrometry (RBS) and hydrogen forward scattering (HFS). The total percentage of elements contained in silicon oxynitride or silicon nitride oxide does not exceed 100 atoms %.

Note that although this embodiment mode will describe the case of forming silicon oxynitride by a plasma CVD method as an example, the present invention is not construed as being limited thereto.

Figure 2:
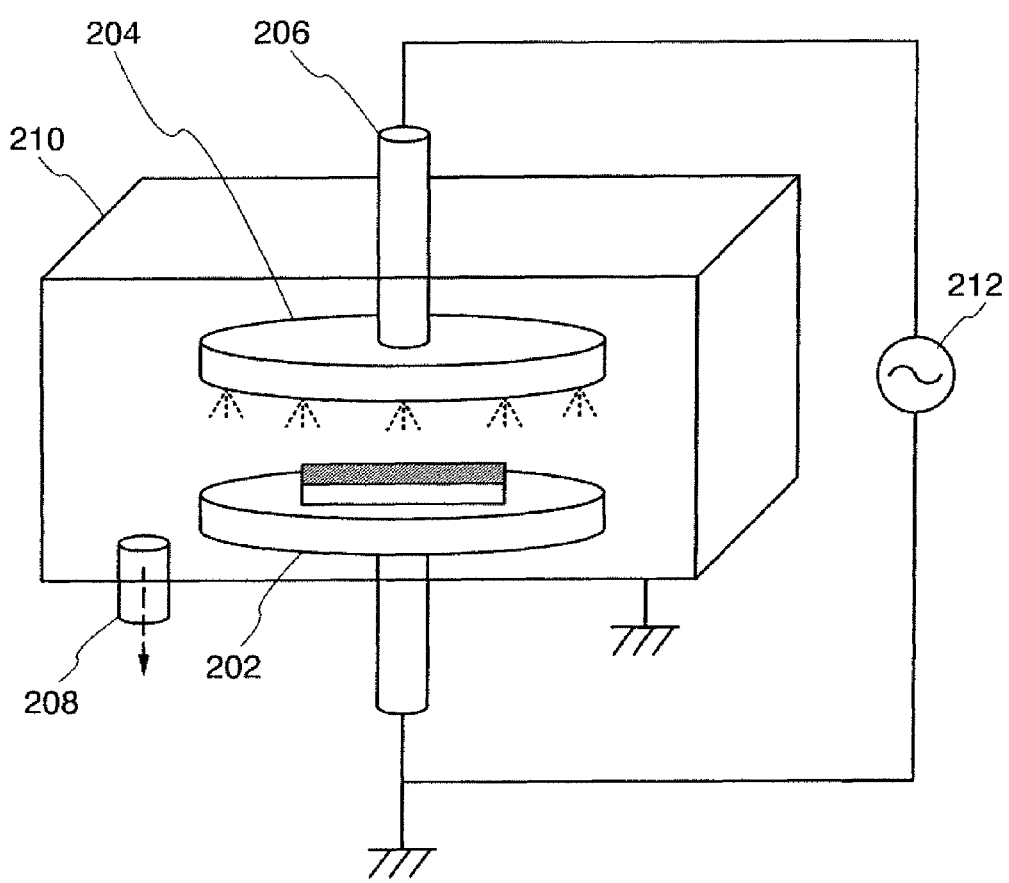
FIG. 2 is a diagram illustrating an example of an apparatus which can be used for formation of an insulating layer.
Figure 3A:
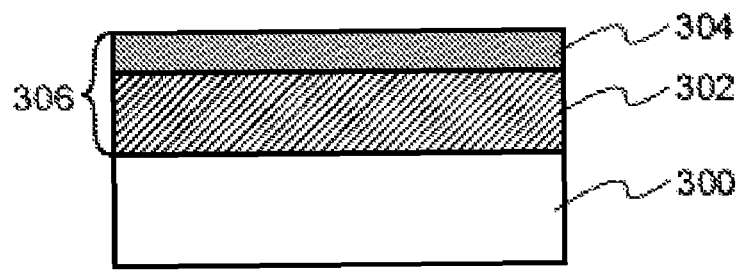
FIGS. 3A to 3C are views illustrating a conventional insulating layer.
Figure 3B:
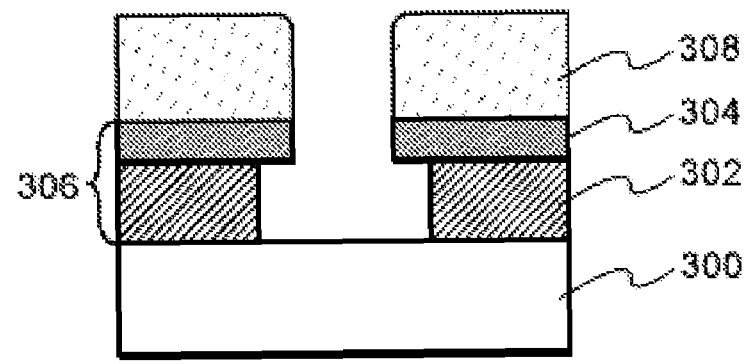
Figure 3C:
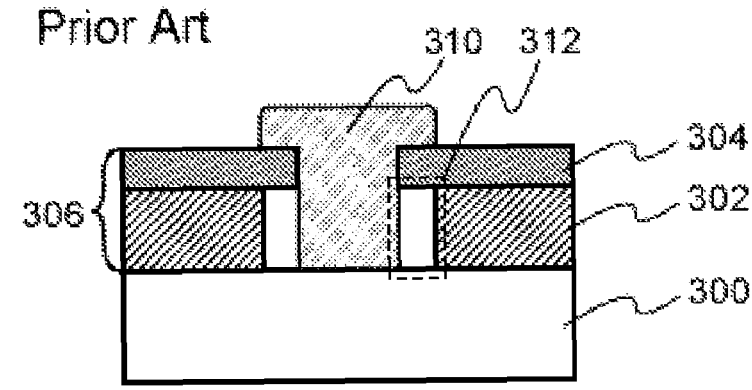

FIG. 2 is an example of a plasma CVD apparatus which can be used for forming an insulating layer of this embodiment mode. A plasma CVD apparatus 200 illustrated in FIG. 2 is provided with a process chamber 210 having a lower electrode 202, an upper electrode 204, a gas introducing portion 206, and an exhaust port 208. The lower electrode 202 and the upper electrode 204 are provided in parallel to each other. The lower electrode 202 is given a ground potential and the upper electrode 204 is given a potential different from a ground potential. Further, plasma is generated between the lower electrode 202 and the upper electrode 204 by high frequency power from a high frequency power source 212. Note that the object to be processed is held over the lower electrode 202 in the process chamber 210.

In this embodiment mode, silicon oxynitride is formed using monosilane and nitrous oxide as a source gas. More specifically, silicon oxynitride is formed using a high frequency power source with an output of 60 W and a frequency of 13.56 MHz under the condition that a flow ratio of monosilane and nitrous oxide is 1:200. The pressure in the process chamber is 133 Pa, the distance between the upper electrode and the lower electrode is 20 mm, and the substrate temperature is 300° C. Under the above condition, silicon oxynitride with low hygroscopicity can be formed. Note that the above condition is only an example and the present invention should not be construed as being limited to the above condition.

Figure 1B:
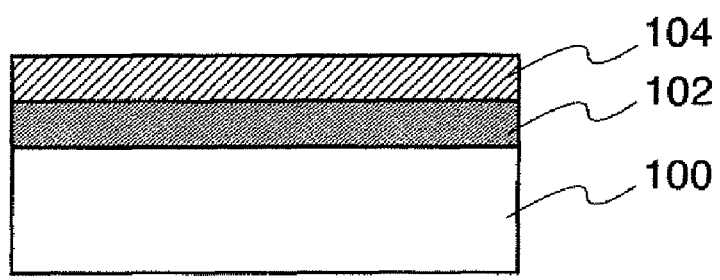

Next, an insulator 104 containing nitrogen and fluorine is formed on a surface of the insulator 102 containing nitrogen (see FIG. 1B).

As a method for forming the insulator 104 containing nitrogen and fluorine, a CVD method, a sputtering method, and the like are given as in the case of the insulator 102 containing nitrogen. Although in this embodiment mode, silicon oxynitride added with fluorine is formed using a plasma CVD method, the present invention is not limited thereto.

Note that the concentration of fluorine may be $1 \times 10^{18}$ atoms/cm$^3$ or more (preferably, $5 \times 10^{18}$ atoms/cm$^3$ or more) so that containing of fluorine proves to be effective. Further, the concentration (upper limit) of fluorine may be approximately $5 \times 10^{21}$ atoms/cm$^3$ (preferably, $1 \times 10^{21}$ atoms/cm$^3$). It is to be noted that the above concentration range also applies to the case where a minute amount of fluorine is contained in the insulator 102 containing nitrogen. Here, the minute amount means that the amount of fluorine in the insulator 102 containing nitrogen is smaller than that in the insulator 104 containing nitrogen and fluorine, and the value of the amount is evaluated based on the concentration of fluorine in the insulator 104 containing nitrogen and fluorine. That is, the above range may include the concentration of fluorine in the insulator 102 containing nitrogen. For example, allowable are the case where the concentration of fluorine in the insulator 104 containing nitrogen and fluorine is $5 \times 10^{19}$ atoms/cm$^3$ and the concentration of fluorine in the insulator 102 containing nitrogen is $5 \times 10^{18}$ atoms/cm$^3$, and the like. This is because it is understood that the essence of the present invention lies in whether the relative concentration of fluorine is high or low. It is needless to say that the concentration of fluorine in the insulator 102 containing nitrogen is preferably less than $5 \times 10^{18}$ atoms/cm$^3$, still more preferably less than $1 \times 10^{18}$ atoms/cm$^3$. In particular, since the insulator 102 containing nitrogen formed at an upper part or a lower part has a higher function of preventing entering of water, it can be said that the concentration of fluorine is preferably low.

Silicon oxynitride containing fluorine can be formed using a plasma CVD method in this embodiment mode as in the case where the insulator 102 containing nitrogen (silicon oxynitride in this embodiment mode) is formed. Specifically, as source gasses, monosilane, nitrous oxide, and nitrogen trifluoride may be used. That is, silicon oxynitride containing fluorine can be formed by adding nitrogen trifluoride to a source gas in the case of forming silicon oxynitride. Note that conditions other than that of a source gas is not necessarily changed in particular, but may be changed as appropriate in the case where there are more optimal conditions. In this embodiment mode, a flow ratio of monosilane, nitrous oxide, and nitrogen trifluoride as source gasses is 1:200:2 and conditions other than that are the same as those in the case where silicon oxynitride is formed. It is needless to say that the present invention should not be construed as being limited thereto.

As described above, a gas containing fluorine is added or not so that the insulator 102 containing nitrogen and the insulator 104 containing nitrogen and fluorine can be deposited as selected. That is, the insulators can be deposited successively in the same chamber. By being successively deposited in the same chamber, the insulator 102 containing nitrogen and the insulator 104 containing nitrogen and fluorine can be formed efficiently. Further, successive deposition in the same chamber is preferable from the perspective that impurities in the insulators can be reduced because the insulators can be deposited without being exposed to the air. In particular, the insulator 104 containing fluorine easily reacts with water in the air; therefore, successive deposition in the same chamber is preferable. Here, in the case where the insulators are successively deposited in the same chamber, an interface separating insulators formed of different materials does not exist. Thus, in the case where an interface separating insulators does not exist, it is not appropriate that each region is expressed as "a film", "a layer", or the like. Therefore, in the present invention, each region is expressed as "a part", "a region", or the like. Note that in the case where influence from impurities in the air is trivial, and the like, the present invention is not limited to successive deposition in the same chamber. Although in the case where successive deposition is not performed, an interface is formed between regions, the case where the interface exists is not excluded even when "a part", "a region" or the like is used.

Note that in the case where insulators are deposited successively in the same chamber as described above, the profile of element concentration of the insulating layer (horizontal axis: depth, longitudinal axis: element concentration) is characteristic. That is, the concentration of fluorine has the peak (maximum value) in a second region, whereas the concentration of any other element (such as nitrogen or silicon) does not have the peak in the second region. Concerning to any other element, the concentration in a first region is substantially the same as that in the second region (although, to be precise, the concentration of any other element is reduced by an increased amount of concentration of fluorine, the increased amount of concentration of fluorine is extremely small when seen from composition of an insulator). This is because composition of the second region is the composition in the first region, to which fluorine is added, and there is no interface in the boundary between the first region and the second region. Note that as a method for analyzing the profile of element concentration in a depth direction, secondary ion mass spectrometry (SIMS) can be given.

Figure 1C:
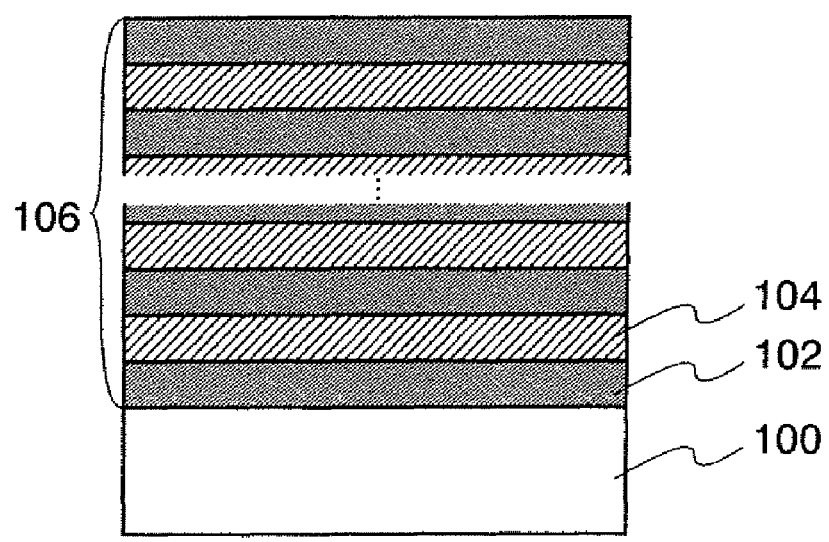

After that, an insulator containing nitrogen and an insulator containing nitrogen and fluorine are alternately deposited further, so that an insulating layer 106 in which a region containing nitrogen and a region containing nitrogen and fluorine are alternately provided can be completed (see FIG. 1C). Note that in this embodiment mode, the uppermost part and the lowermost part of the insulating layer 106 are each provided with an insulator containing nitrogen. This is because a highly hygroscopic region (an insulator containing nitrogen and fluorine) is sandwiched between low hygroscopic regions (insulators containing nitrogen) so that moisture can be prevented from being absorbed by the highly hygroscopic region. On the other hand, in the case where it is not a big problem that moisture enters from above or below the insulating layer 106, each of the uppermost part or the lowermost part of the insulating layer 106 is not necessarily an insulator containing nitrogen.

Note that it is possible that an insulator containing nitrogen and fluorine be sandwiched so as to be protected from moisture by using a material having still lower hygroscopicity (or permeability) than silicon oxynitride or silicon nitride oxide. As such a material with lower hygroscopicity, silicon nitride and the like are given.

Since it is true that silicon nitride is a dense material, moisture can be sufficiently prevented from permeating or entering silicon oxynitride containing fluorine by covering the silicon oxynitride containing fluorine with silicon nitride. However, silicon oxynitride (containing fluorine) and silicon nitride have significantly different etching rates. That is, silicon nitride is harder to be etched than silicon oxynitride; therefore, in the case where an insulating layer 306 is formed of silicon oxynitride 302 containing fluorine over a substrate 300 and silicon nitride 304 formed so as to cover the silicon oxynitride 302 containing fluorine (see FIG. 3A) and the insulating layer 306 is etched with a resist mask 308, there occurs a problem that the insulating layer 306 is etched to have an eave shape (see FIG. 3B). In the case where the insulating layer 306 thus has an eave shape, a space 312 is formed between the insulating layer 306 and a structure 310 formed thereafter, so that a dielectric strength voltage is reduced (see FIG. 3C). Further, the space 312 described above serves as a path through which moisture enters; therefore, also in this case, there eventually occurs the problem of moisture absorption.

In order to prevent the problem described above, it is preferable to use materials having close etching rates. That is, as described in this embodiment mode, it is preferable to use a material added with no fluorine and a material added with fluorine, such as silicon oxynitride and silicon oxynitride containing fluorine. Accordingly, etching rates can be substantially the same and thus formation of the space can be prevented.

Note that although silicon oxynitride slightly inferior in hygroscopicity to silicon nitride is used in this embodiment mode, the disadvantage is compensated by devising the structure of the insulating layer. That is, by using silicon oxynitride in the uppermost part for a protective region, moisture is prevented from entering the other regions. Although the silicon oxynitride in the uppermost part is slightly changed in thickness by absorbing moisture, the silicon oxynitride in the uppermost part originally has a small thickness so that the insulating layer 106 does not seem to be changed so much in thickness when seen as a whole. Thus, in the case where the insulating layer 106 is seen as a whole, it can be said that the insulating layer 106 has highly favorable characteristics as the insulating layer of a semiconductor device.

Further, in this embodiment mode, silicon oxynitride containing fluorine is formed so that a dielectric constant is reduced. Here, by forming silicon oxynitrides containing fluorine to be thick, the dielectric constant can be further reduced; however, it is preferred that the total thickness of silicon oxynitrides containing fluorine occupy approximately 70% or less of the thickness of the insulating layer 106 in this embodiment mode. This is because in the case where the thickness of the silicon oxynitride serving as a protective region is equal to or smaller than a certain thickness, it is difficult to sufficiently prevent entering of water. On the other hand, in order that reduction in dielectric constant be more effective, it is preferred that the total thickness of the silicon oxynitrides containing fluorine occupy approximately 10% or more of the thickness of the insulating layer 106.

In order to effectively prevent entering of water and obtain characteristics of a low dielectric constant, for example, it is preferable to use the structure in which a silicon oxynitride in the uppermost part is formed to be thick and silicon oxynitrides in the lower part are each formed to be thin. Accordingly, water can be prevented from entering from above the semiconductor device. Further, even if water can enter the insulating layer 106 due to existence of a pin hole or the like, entering of water can be avoided by at least the silicon oxynitride in the other region of the insulating layer 106.

Figure 4A:
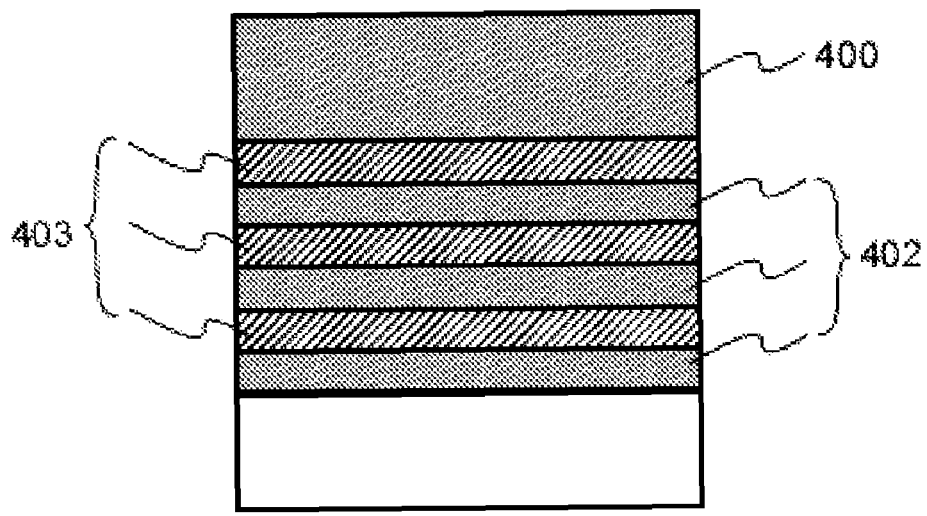
FIGS. 4A and 4B are views each illustrating an example of the structure of an insulating layer.

As for an example of the structure of the insulating layer described above, the thickness of a silicon oxynitride in the uppermost part 400 can be 50% or more of the total thickness of silicon oxynitrides and thus can be approximately the same as that of silicon oxynitrides in the other region 402 (see FIG. 4A). It is needless to say that silicon oxynitrides 404 may be formed so that the thicknesses thereof are gradually increased from the lower part to the upper part of the insulating layer (so that the thicknesses thereof are gradually reduced from the upper part to the lower part of the insulating layer) (see FIG. 4B). Note that although the thicknesses of silicon oxynitrides 403 containing fluorine are approximately the same in FIGS. 4A and 4B, the present invention is not limited thereto. The thicknesses of the silicon oxynitrides 403 containing fluorine can be arbitrarily set. Further, FIGS. 4A and 4B each show the insulating layer formed of seven regions, the present invention is not construed as being limited to the structure.

Figure 5A:
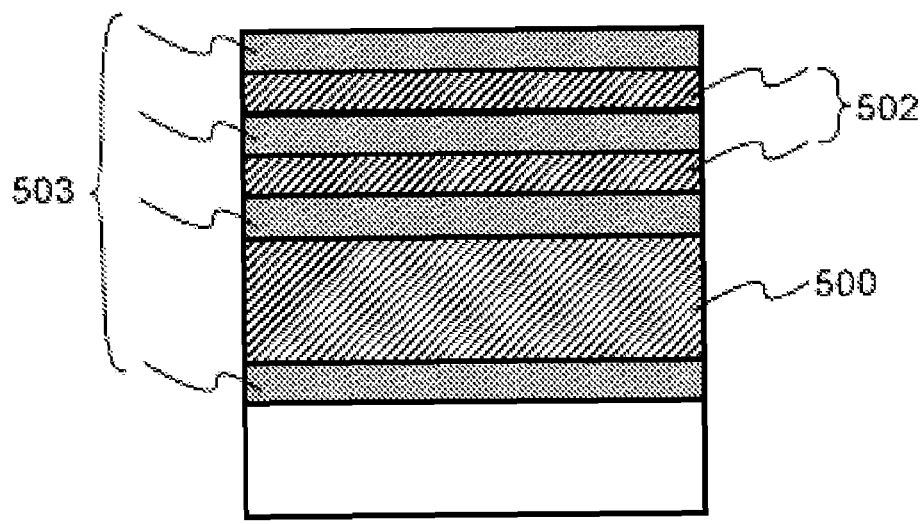
FIGS. 5A and 5B are views each illustrating an example of the structure of an insulating layer.

As for a silicon oxynitride containing fluorine, similarly, the thickness of a silicon oxynitride 500 containing fluorine in the lowermost part occupies 50% or more of the total thickness of silicon oxynitrides containing fluorine, and the thicknesses of silicon oxynitrides 502 can be approximately the same (see FIG. 5A). It is needless to say that silicon oxynitrides 504 containing fluorine may be formed so that the thicknesses thereof are gradually reduced from the lower part to the upper part (so that the thicknesses thereof are gradually increased from the upper part to the lower part) (see FIG. 5B). Note that although the thicknesses of silicon oxynitrides 503 are approximately the same in FIGS. 5A and 5B, the present invention is not limited thereto. The thicknesses of the silicon oxynitrides 503 can be arbitrarily set. Further, although FIGS. 5A and 5B each show the insulating layer formed of seven regions, the present invention is not construed as being limited to the structure.

Figure 4B:
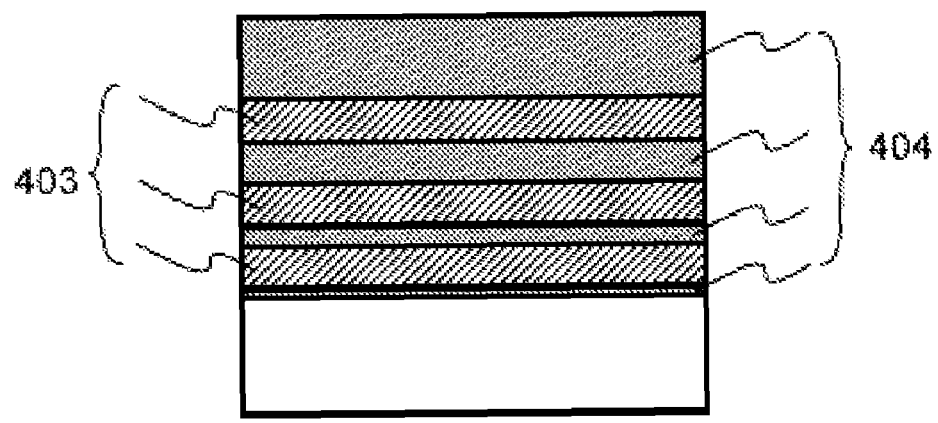
Figure 5B:
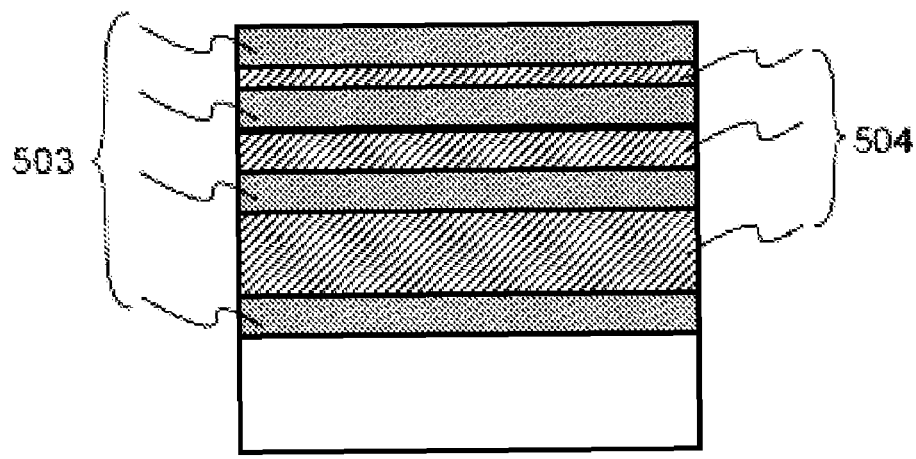
Figure 6A:
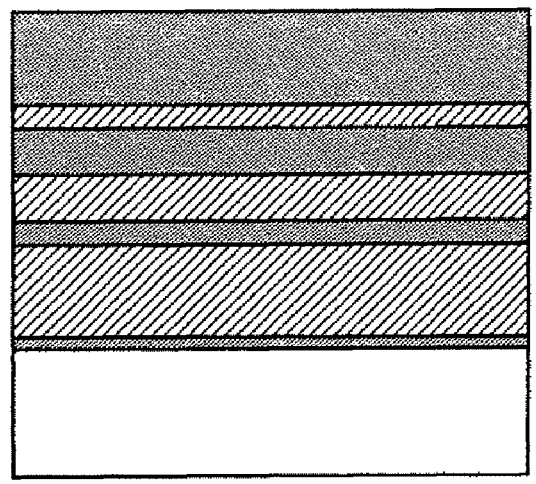
FIGS. 6A and 6B are views each illustrating an example of the structure of an insulating layer.
Figure 6B:
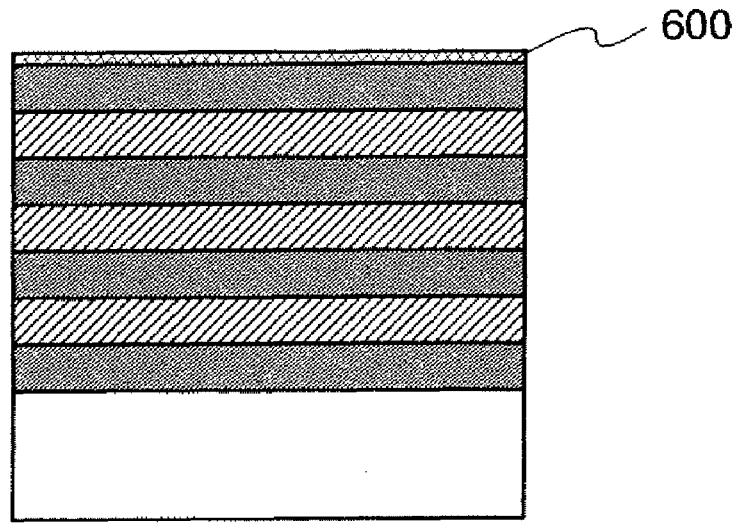

It is needless to say that the structure of silicon oxynitrides in FIGS. 4A and 4B and that of silicon oxynitrides containing fluorine in FIGS. 5A and 5B may be used in combination. For example, silicon oxynitrides can be formed so that the thicknesses thereof are reduced from the upper part to the lower part and silicon oxynitrides containing fluorine can be formed so that the thicknesses thereof are increased from the upper part to the lower part (see FIG. 6A). Thus, an insulator serving as a protective region is formed to be thick in the upper part and an insulator capable of reducing a dielectric constant is formed to be thick in the lower part, so that the disadvantage due to entering of water from above can be sufficiently prevented and the dielectric constant can be efficiently reduced.

Alternatively, an extremely thin silicon nitride may be formed in the uppermost part. In specific, a silicon nitride 600 with a thickness of approximately 5 nm or less is formed (see FIG. 6B). Thus, even when the silicon nitride is formed, a defect due to etching can be prevented from occurring in the case where the thickness thereof is sufficiently reduced. Further, even in the case of being formed to be extremely thin, the silicon nitride has a high effect of preventing entering of water. Therefore, by forming the extremely thin silicon nitride in the uppermost part, water resistance can be further improved. It is to be noted that in this case, only the uppermost part is anomalistically the insulating layer formed of the silicon nitride. Specifically, the silicon nitride is in the uppermost part, a silicon oxynitride is in the second region from the top, a silicon oxynitride containing fluorine is in the third region from the top, a silicon oxynitride is in the fourth region from the top, and a silicon oxynitride containing fluorine is in the fifth region from the top. Note that the structure in which the thin silicon nitride is formed may also be combined with any of the structures in FIGS. 4A and 4B, FIGS. 5A and 5B, and FIG. 6A as appropriate.

Note that although the case of using silicon oxynitride and silicon oxynitride containing fluorine is described in this embodiment mode, the present invention is not construed as being limited thereto. Silicon nitride oxide and silicon nitride oxide containing fluorine, an insulator containing nitrogen, or an insulator containing nitrogen and fluorine may be used.

The insulating layer described in this embodiment mode can efficiently prevent insulators containing nitrogen and fluorine from absorbing moisture by including a plurality of regions each formed of an insulator containing nitrogen. Thus, the insulating layer can be sufficiently prevented from being changed in thickness and reduction in a dielectric strength voltage and mechanical strength can be prevented. Further, insulators containing nitrogen and fluorine are included so that the insulating layer whose dielectric constant is low can be obtained. Further, materials having close etching rates are used so that a defect due to etching does not easily occur and reduction in dielectric strength voltage, or the like can be prevented.

Further, also in the case where processing is performed applying dry etching, a tapered shape is easily formed and thus a surface of the insulating layer can be favorably covered with a film. Note that it is understood that such a tapered shape can be formed using dry etching because the concentration of fluorine in a chamber is gradually increased so that the concentration of fluorine in the insulator in the upper part is increased. In this sense, it can be said that the insulator in the upper part contains a larger amount of fluorine than the insulator in the lower part.

As described above, by using the structure in this embodiment mode, a favorable insulating layer can be formed. Accordingly, a semiconductor device with high performance and high reliability can be provided.

Embodiment Mode 2

In this embodiment mode, an example of a semiconductor device using an insulating layer of the present invention will be described with reference to FIGS. 7A to 7D, FIGS. 8A to 8C, FIGS. 9A to 9D, FIGS. 10A to 10C, and FIGS. 11A to 11C.

Here, a semiconductor device using a so-called SOI (silicon on insulator) substrate will be described. An SOI substrate is provided with a thin single crystal semiconductor layer on the insulating surface thereof. By using this, a semiconductor device with high performance can be obtained. In this embodiment mode, used is an SOI substrate obtained by providing a single crystal semiconductor layer over a base substrate using a glass material or the like with an insulating layer serving as a bonding layer interposed therebetween. Note that an SOI substrate used in this embodiment mode is obtained by separating a single crystal semiconductor substrate at region, into which ions are introduced, to form a single crystal semiconductor layer over a base substrate.

Note that although a semiconductor device using an SOI substrate is described in this embodiment mode, the semiconductor device of the present invention is not construed as being limited to a semiconductor device using an SOI substrate. The present invention can also be applied to a semiconductor device using a single crystal semiconductor substrate, and a semiconductor device provided with an amorphous semiconductor, a microcrystalline semiconductor, a polycrystalline semiconductor, or the like over a glass substrate or the like.

First, a method for manufacturing a semiconductor substrate (SOI substrate) used in this embodiment mode will be described with reference to FIGS. 7A to 7D and FIGS. 8A to 8C. Here, the case of providing an insulating layer serving as a bonding layer on the single crystal semiconductor substrate side and the case of providing an insulating layer serving as a bonding layer on the base substrate (hereinafter also referred to as a substrate having an insulating surface) side will be described with reference to FIGS. 7A to 7D and FIGS. 8A to 8C, respectively.

First, a single crystal semiconductor substrate 700 is prepared. Then, ions are introduced to a predetermined depth from the surface of the single crystal semiconductor substrate 700 to form an embrittlement layer 702 and a single crystal semiconductor layer 704 (see FIG. 7A). As a method for forming the embrittlement layer 702, a method used for adding an impurity element to a semiconductor layer (hereinafter referred to as an ion doping method), a method for performing mass separation of an ionized gas so that the ionized gas is selectively implanted into a semiconductor layer (hereinafter referred to as an ion implantation method), and the like can be given. Ion irradiation may be performed in consideration of the thickness of the single crystal semiconductor layer 704 which is formed. The thickness of the single crystal semiconductor layer 704 may be approximately 5 to 500 nm, preferably 10 to 200 nm. The accelerating voltage at ion irradiation can be determined in consideration of the above-described thickness of the single crystal semiconductor layer 704.

The single crystal semiconductor substrate 700 is not particularly limited as long as it is a substrate made of a single crystal semiconductor, and a single crystal silicon substrate is used as an example in this embodiment mode. Alternatively, a substrate made of a semiconductor such as germanium, gallium arsenide, or indium phosphide can be applied.

As ions for irradiation, ions of hydrogen, helium, halogen typified by fluorine, and the like can be given. When fluorine ions are used as halogen ions for irradiation, $BF_3$ may be used as a source gas. For example, when a single crystal silicon substrate is used as the single crystal semiconductor substrate 700 and the single crystal silicon substrate is irradiated with halogen ions such as fluorine ions, minute voids are formed in the embrittlement layer 702. It is understood that this is because the halogen ions, with which the single crystal silicon substrate is irradiated, removes silicon atoms in a silicon crystal lattice. The volumes of the minute voids thus formed are changed in this manner, so that the single crystal silicon substrate can be separated. Specifically, the volume change of the minute voids is induced by low-temperature heat treatment. Note that hydrogen ion irradiation may be performed after fluorine ion irradiation is performed, so that hydrogen is contained in the voids.

Alternatively, the single crystal silicon substrate may be irradiated with a plurality of ions of the same atom, which have different masses. For example, hydrogen ion irradiation can be performed by using $H^+$, $H_2^+$, and $H_3^+$ ions, and it is preferred that the proportion of $H_3^+$ ions be increased. Increase in the proportion of $H_3^+$ results in increase in the irradiation efficiency; thus, the irradiation time can be shortened. It is understood that hydrogen contained in the embrittlement layer 702 separates the single crystal semiconductor layer 704 from the single crystal semiconductor substrate 700 by rapid reaction due to heat treatment.

For example, by an ion doping method using a hydrogen gas for a raw material, irradiation with ions of $2.2 \times 10^{16}$ ions/cm$^2$ can be performed at an accelerating voltage of 40 kV. An acceleration voltage may be approximately 20 to 100 kV, and in this case, irradiation with ions of approximately $1.8 \times 10^{16}$ to $2.6 \times 10^{16}$ ions/cm$^2$ is performed.

Note that plasma treatment may be performed on a surface of the single crystal semiconductor layer 704. Specifically, the plasma treatment is performed under a hydrogen atmosphere, an oxygen atmosphere, or a mixed atmosphere of oxygen and hydrogen. By performing the plasma treatment under the hydrogen atmosphere, the surface is etched so that contaminant can be removed. Further, part of the surface of the single crystal semiconductor layer 704 can be removed and thus an inner dense region can be exposed. Further, dangling bonds in the single crystal semiconductor layer 704 can be terminated by hydrogen. Meanwhile, by performing the plasma treatment under the oxygen atmosphere, a dense oxide film can be formed on the surface of the single crystal semiconductor layer 704. In other words, by performing the plasma treatment under these atmospheres, the interface between the single crystal semiconductor layer 704 and an insulating layer to be formed later over the single crystal semiconductor layer 704 can be kept clean and a defect can be reduced. Note that an advantageous effect which is similar to that of this embodiment mode can be obtained even if a rare gas element is added to any of the above atmospheres.

Note that as a method for reducing the defect at the interface, there is also a method of forming an oxide film by a thermal oxidation method. However, the condition of a high temperature required for thermal oxidation is not suitable for the manufacturing method described in this embodiment mode. That is, in the manufacturing method described in this embodiment mode, although separation of the single crystal semiconductor layer is conducted by heat treatment, the temperature of the heat treatment is comparatively low at approximately 400 to 600° C. On the other hand, the temperature required for the thermal oxidation is 800° C. or higher, and in the case where such a high temperature process is employed in this embodiment mode, separation of the single crystal semiconductor layer 704 is advanced. For the foregoing reasons, it is apparent that the plasma treatment is preferred to decrease the defects at the interface in this embodiment mode.

Note that as the plasma treatment, plasma treatment using a high frequency wave (such as a microwave) under the conditions of high density (preferably, in the range of $1 \times 10^{11}$ to $1 \times 10^{13}$ cm$^{-3}$) and a low electron temperature (preferably, in the range of 0.2 to 2.0 eV, more preferably, in the range of 0.5 to 1.5 eV) is preferably performed (the plasma treatment is hereinafter referred to as high-density plasma treatment). Such high density plasma treatment that features a low electron temperature has low kinetic energy of active species; therefore, a damage due to plasma is smaller than that in the case of normal plasma treatment. Therefore, a more favorable interface as compared with the one formed by the normal plasma treatment can be formed. Note that the high density plasma treatment is preferably performed in a mixed atmosphere of hydrogen and a rare gas (helium, neon, argon, krypton, xenon, or the like), or a mixed atmosphere of oxygen, hydrogen, and a rare gas.

Note that although the case of performing the plasma treatment in the atmosphere containing at least hydrogen or oxygen is described in this embodiment mode, the present invention is not construed as being limited thereto. For example, the plasma treatment may be performed in an atmosphere containing nitrogen oxide, ammonia, nitrogen, or the like, or in a mixed atmosphere of any of these gases and hydrogen, oxygen, a rare gas, or the like.

Figure 7A:
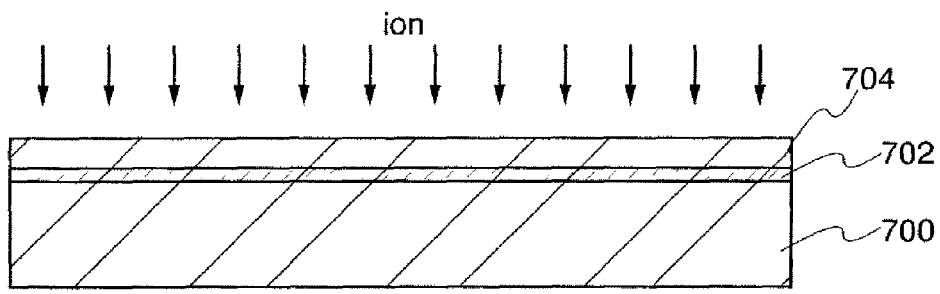
FIGS. 7A to 7D are views illustrating a process for forming a semiconductor substrate.
Figure 7B:
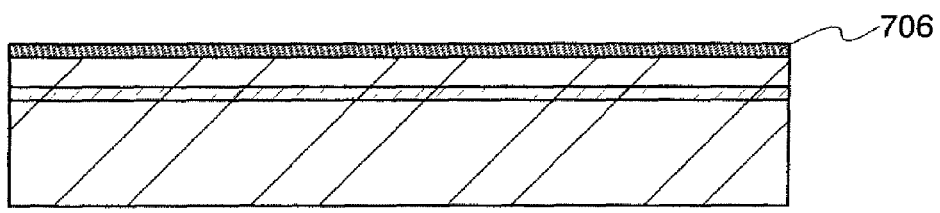

Next, an insulating layer 706 serving as a bonding layer is formed over the single crystal semiconductor layer 704 (see FIG. 7B). The insulating layer 706 may be formed of a silicon oxide film by a chemical vapor deposition method (CVD method) using an organosilane gas. Alternatively, a silicon oxide film which is formed by a chemical vapor deposition method using a silane gas may be applied. In the case of using a chemical vapor deposition method, it is necessary to perform film formation under the temperature condition in which degasification does not occur from the embrittlement layer 702. Note that as to heat treatment for separating the single crystal semiconductor layer 704 from the single crystal semiconductor substrate 700, a temperature higher than a film formation temperature is applied.

Note that examples of an organosilane gas include tetraethoxysilane (TEOS), trimethylsilane, tetramethylsilane, tetramethylcyclotetrasiloxane (TMCTS), octamethylcyclotetrasiloxane (OMCTS), hexamethyldisilazane (HMDS), triethoxysilane, trisdimethylaminosilane, and the like.

As the insulating layer 706, a silicon oxynitride film may be formed by an LPCVD method using monosilane and nitrogen dioxide as source gases. Accordingly, the favorable insulating layer 706 can be formed even under the condition of a low temperature from 300 to 400° C., inclusive. For example, a favorable insulating layer can be formed under the condition where the flow rate of monosilane is 40 sccm, the flow rate of nitrogen dioxide is 400 sccm, the pressure is 266.6 Pa, and the temperature is 350° C.

The above-described insulating layer 706 is formed to a thickness of approximately 5 to 500 nm. Accordingly, a growing surface of the insulating layer 706 can be smoothed. In addition, distortion of the substrate to be bonded can be mitigated. Note that a substrate having an insulating surface, which is to be used later, can also be provided with a similar insulating layer. The single crystal semiconductor substrate 700 and the substrate having an insulating surface can be strongly bonded together by thus providing a silicon oxide film, which is formed with organosilane as a raw material, for either one or both of the bonding surfaces.

Note that an insulating layer containing nitrogen may be provided between the single crystal semiconductor layer 704 and the insulating layer 706. The insulating layer containing nitrogen can be formed using silicon nitride, silicon nitride oxide, silicon oxynitride, or the like. Note that the insulating layer containing nitrogen may have a single-layer structure or a layered structure. For example, a silicon oxynitride film and a silicon nitride oxide film can be stacked in this order over the single crystal semiconductor layer 704 to form the insulating layer containing nitrogen. The insulating layer containing nitrogen is formed to prevent intrusion of impurities such as movable ions like alkali metal or alkaline earth metal or water into the single crystal semiconductor layer 704. Note that an insulating layer other than the insulating layer containing nitrogen may be provided as long as it can prevent intrusion of impurities. Further, in the case of forming the insulating layer containing nitrogen, the insulating layer 706 and the insulating layer containing nitrogen may be collectively referred to as an insulating layer.

Figure 7C:
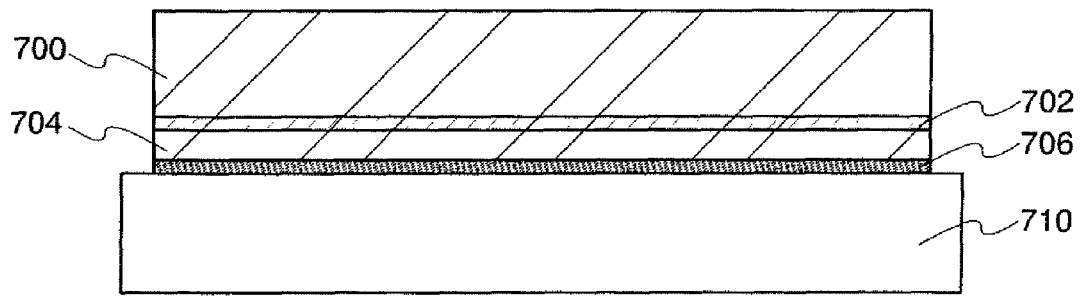

Next, a substrate 710 having an insulating surface (a base substrate) and the insulating layer 706 are disposed in close contact with each other (see FIG. 7C). The substrate 710 having an insulating surface and the insulating layer 706 are disposed in close contact with each other and pressure is applied thereto, so that the substrate 710 having an insulating surface and the insulating layer 706 can be bonded firmly to each other. Note that it is preferred to perform heat treatment after the substrate 710 having an insulating surface and the single crystal semiconductor substrate 700 are bonded to each other with the insulating layer 706 interposed therebetween. The bonding strength can be further enhanced by performing heat treatment.

In order to form a favorable bond, the surface to be bonded may be activated. For example, the surface which is bonded is irradiated with an atomic beam or an ion beam. When an atomic beam or an ion beam is used, an inert gas atomic beam or inert gas ion beam of argon or the like can be used. Alternatively, plasma treatment or radical treatment may be performed. Such surface treatment makes it possible to form a bond between different kinds of materials at a low temperature of approximately from 200 to 400° C.

Note that as the substrate 710 having an insulating surface, any of various glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a sixth generation substrate (1500 mm×1850 mm), a seventh generation substrate (1870 mm×2200 mm), and an eighth generation substrate (2200 mm×2400 mm), for example. A mother glass substrate having a large area is used as the substrate 710 having an insulating surface, so that the area of the semiconductor substrate can be enlarged. Note that the substrate 710 having an insulating surface is not limited to the above-described substrates. For example, a substrate made from a resin material may be used as long as its allowable temperature limit is higher than the maximum temperature of the process. In the manufacturing method of this embodiment mode, a high temperature process is not required; therefore, a substrate whose allowable temperature limit is low can be used.

Further, an insulating layer serving as a barrier layer may be formed over the substrate 710 having an insulating surface. The insulating layer is formed so that impurities such as alkali metal and alkaline earth metal can be prevented from entering the single crystal semiconductor layer 704. It is needless to say that the insulating layer serving as a barrier layer is not necessarily formed when intrusion of the impurities from the substrate 710 having an insulating surface into the single crystal semiconductor layer 704 does not cause any problems.

The above-described insulating layer can be formed of one or a plurality of materials selected from silicon oxide, silicon nitride, silicon nitride oxide, silicon oxynitride, and the like. The insulating layer may have a single-layer structure or a layered structure. For example, an insulating layer having the structure in which silicon nitride and silicon oxide are sequentially stacked from the side of the substrate 710 having an insulating surface can be used. Note that materials that are used are not limited to the above-described materials as long as they can prevent intrusion of impurities.

Figure 7D:
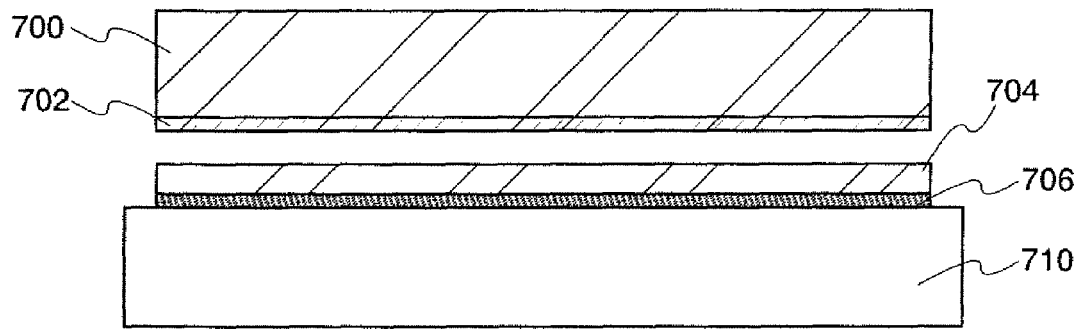

Next, heat treatment is performed to separate the single crystal semiconductor layer 704 from the single crystal semiconductor substrate 700 at the embrittlement layer 702 (see FIG. 7D). For example, heat treatment is performed at a temperature from 400 to 600° C., which increases pressure in the minute voids formed in the embrittlement layer 702 and thus induces the volume expansion, so that the single crystal semiconductor layer 704 can be separated. Since the insulating layer 706 is bonded to the substrate 710 having an insulating surface, the single crystal semiconductor layer 704 with the same crystallinity as that of the single crystal semiconductor substrate 700 remains over the substrate 710 having an insulating surface.

Note that heat treatment may be performed at a temperature in a range of approximately 150 to 350° C. before the above-described heat treatment, so that the bonded interface can be strengthened. Accordingly, even when materials having different thermal expansion coefficients are bonded, separation from the bonded interface can be suppressed. For example, heat treatment at 200° C. for two hours may be employed.

When a glass substrate is used as the substrate 710 having an insulating surface, heat treatment may be performed at around a strain point of a glass substrate, specifically at a temperature in a range of ±50° C. of the strain point. More specifically, heat treatment may be performed at a temperature of approximately 580 to 680° C. Note that a glass substrate has a property of contraction by heat. Therefore, when a glass substrate is heated approximately at a strain point, specifically at a temperature in a range of approximately ±50° C. of the strain point (or higher) in advance and then cooled down, contraction in subsequent heat treatment can be suppressed. Accordingly, even when heat treatment is performed on a glass substrate, to which a single crystal semiconductor layer having a thermal expansion coefficient different from that of the glass substrate is bonded, separation of the bonded single crystal semiconductor layer from the glass substrate can be prevented. Further, transformation such as a warp of the glass substrate and the single crystal semiconductor layer can be prevented.

Note that when a glass substrate is used, it is preferred to avoid rapid cooling at the termination of heating. Specifically, the glass substrate may be cooled down to a temperature of a strain point or less at a rate of 2° C./min. or less, preferably 1 to 2° C./min., inclusive. The temperature reduction rate is reduced, so that local stress which is caused by the contraction of the glass substrate can be relieved. The heat treatment may be performed under an atmospheric pressure or a reduced pressure. As to an atmosphere, a nitrogen atmosphere, an oxygen atmosphere, or the like can be set as appropriate. Note that the heat treatment can be applied to not only a glass substrate but a substrate having a property of contraction after being heated. Specifically, after heat treatment at 200° C. for two hours, heat treatment at 600° C. for two hours may be performed.

Note that heat treatment related to the bonding step and heat treatment related to the separation step may be performed simultaneously. In this case, the two steps can be performed simultaneously in a single heat treatment; therefore, a semiconductor substrate can be manufactured at low cost.

As to the single crystal semiconductor layer 704 which is obtained through the above-described steps, planarization by chemical mechanical polishing (CMP) is preferably performed. As a planarization method, etching treatment, etch back treatment, irradiation with a laser beam, and the like are also given. By improving the single crystal semiconductor layer 704 in planarity, variation of a semiconductor element to be formed subsequently can be suppressed. Note that CMP, etching treatment, etch back treatment, irradiation with a laser beam, or the like may be omitted, if desired characteristics can be obtained. Alternatively, characteristics of the single crystal semiconductor layer 704 may be improved by performing heating again. Note that a temperature at heat treatment can be set at around the allowable temperature limit of the substrate 710 having an insulating surface. When a glass substrate is used as the substrate 710 having an insulating surface, the temperature at heat treatment may be set at around a strain point of the glass substrate. Specifically, heat treatment may be performed at a temperature in a range of approximately ±50° C. of the strain point (for example, from 580 to 680° C. inclusive).

As to the laser light irradiation, a continuous-wave laser (a CW laser), a pulsed laser (the repetition rate of which is from 10 to 100 MHz inclusive), or the like can be used. Specifically, as the continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a helium cadmium laser, or the like can be used. As the pulsed laser, an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like can be used.

In particular, irradiation with a laser beam in a low oxygen concentration atmosphere in which the concentration of oxygen is 10 ppm or less is performed so that at least the upper part of the single crystal semiconductor layer is melted and thereby a surface of the single crystal semiconductor layer can be efficiently planarized. It is needless to say that any of irradiation with a laser beam, CMP, etching treatment, etch back treatment, and the like may be used in combination.

Figure 8A:
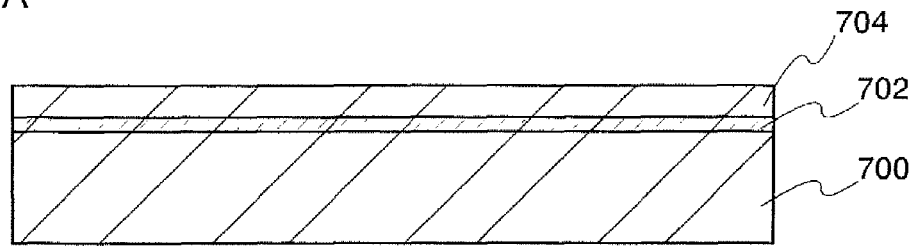
FIGS. 8A to 8C are views illustrating a process for forming a semiconductor substrate.

Next, the case in which the insulating layer 706 serving as a bonding layer is provided on the side of the substrate 710 having an insulating surface is described with reference to FIGS. 8A to 8C. Note that since steps of forming the embrittlement layer 702 are similar to those illustrated in FIGS. 7A to 7D, the details are omitted. In the case of performing plasma treatment, it is possible to refer to the above description.

Figure 8B:
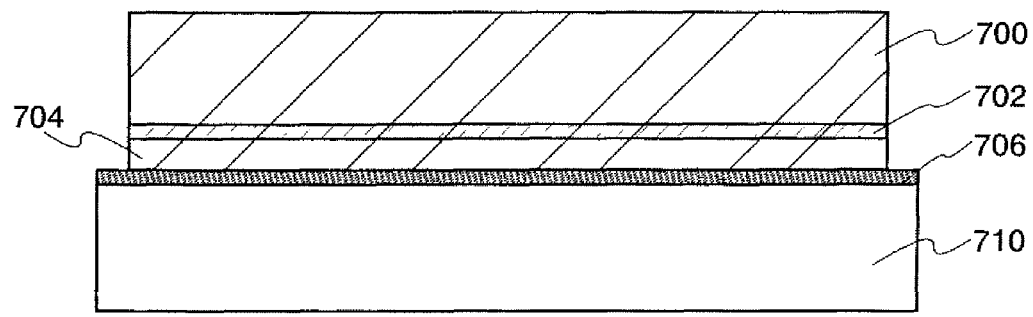

After the embrittlement layer 702 is formed (see FIG. 8A), the insulating layer 706 serving as a bonding layer, which is formed over the substrate 710 having an insulating surface, is disposed in close contact with and bonded to the single crystal semiconductor layer 704 (see FIG. 8B). Note that after an insulating layer serving as a barrier layer is formed, the insulating layer 706 may be formed. By providing such an insulating layer serving as a barrier layer, intrusion of impurities such as alkali metal or alkaline earth metal into the single crystal semiconductor layer 704 can be prevented. It is needless to say that such an insulating layer serving as a barrier layer is not necessarily provided in the case where intrusion of impurities into the single crystal semiconductor layer 704 from the substrate 710 having an insulating surface does not cause any problems.

The above-described insulating layer serving as a barrier layer can be formed using one or a plurality of materials selected from silicon oxide, silicon nitride, silicon nitride oxide, silicon oxynitride, or the like. The insulating layer may have a single-layer structure or a layered structure. For example, an insulating layer having the structure in which silicon nitride and silicon oxide are sequentially stacked from the side of the substrate 710 having an insulating surface may be used. Note that any of the above-described materials is not necessarily used for forming the insulating layer serving as a barrier layer as long as intrusion of impurities can be prevented.

Figure 8C:
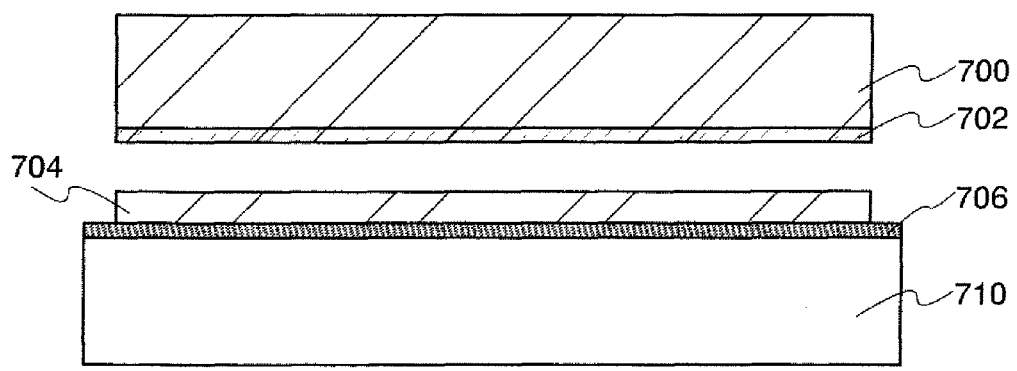

After that, the single crystal semiconductor substrate 700 is separated (see FIG. 8C). Since heat treatment at separation of the single crystal semiconductor substrate 700 can be performed similarly to that of the case in FIG. 7D, the details are omitted. Thus, the semiconductor substrate illustrated in FIG. 8C can be obtained.

For the semiconductor substrate illustrated ion FIG. 8C, chemical mechanical polishing (CMP), etching treatment, etch back treatment, irradiation with a laser beam, or the like is also preferably performed. Note that CMP, etching treatment, etch back treatment, irradiation with a laser beam, or the like may be omitted, if desired characteristics can be obtained.

Alternatively, characteristics of the single crystal semiconductor layer 704 may be improved by performing heating again. As to the temperature at heat treatment and a laser which can be used, it is possible to refer to the above descriptions; therefore, the descriptions are omitted here.

Note that plasma treatment may be performed on a surface of the single crystal semiconductor layer 704. Accordingly, an extremely high-quality semiconductor substrate can be provided.

Next, an example of a method for manufacturing a semiconductor device by using the above-described semiconductor substrate is described with reference to FIGS. 9A to 9D, FIGS. 10A to 10C, and FIGS. 11A to 11C. Note that here, a complementary semiconductor device (a so-called CMOS) is exemplified as a semiconductor device using an n-channel transistor and a p-channel transistor.

Figure 9A:
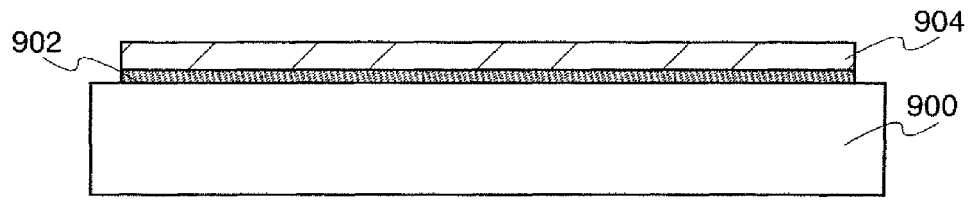
FIGS. 9A to 9D are views illustrating an example of a method for forming a semiconductor device.

First, a semiconductor substrate is prepared (see FIG. 9A). Although, here, description is made using the structure in which an insulating layer 902 serving as a bonding layer and a single crystal semiconductor layer 904 are sequentially formed over a substrate 900 having an insulating surface (the structure similar to that of FIG. 7D), the present invention is not limited thereto.

Next, the single crystal semiconductor layer 904 and the insulating layer 902 are patterned into desired shapes so that an island-shaped single crystal semiconductor layer is formed. Note that they may be patterned as selected so that the insulating layer 902 remains. The more the insulating layer 902 remains, the less impurities from the substrate having an insulating surface intrudes.

Note that as to an etching process in the patterning, either plasma etching (dry etching) or wet etching may be employed. In the case of processing a large substrate, plasma etching is suitable. As an etching gas, a fluorine-based gas or a chlorine-based gas such as $CF_4$, $NF_3$, $Cl_2$, or $BCl_3$ is used. An inert gas such as He or Ar may be added to the etching gas appropriately. Alternatively, electric discharge may be locally performed when the etching process is performed using atmospheric pressure discharge, and thus a mask layer is not required to be formed over an entire surface of the substrate.

After the single crystal semiconductor layer 904 and the insulating layer 902 are patterned, a p-type impurity such as boron, aluminum, or gallium may be added in order to control a threshold voltage. For example, as the p-type impurity, boron can be added at a concentration of $5 \times 10^{16}$ to $1 \times 10^{18}$ atoms/cm$^3$, inclusive.

Note that although not described in this embodiment mode, the structure in which an insulating layer serving as a barrier layer may be provided over the substrate 900 having an insulating surface, may be employed. For the insulating layer serving as a barrier layer, a stack of a silicon nitride film and a silicon oxide film may be used, for example. By providing the insulating layer serving as a barrier layer, the single crystal semiconductor layer 904 can be prevented from being contaminated by movable ions from the substrate 900 having an insulating surface. Note that silicon nitride oxide, aluminum nitride, or aluminum nitride oxide may be used instead of silicon nitride.

Figure 9B:
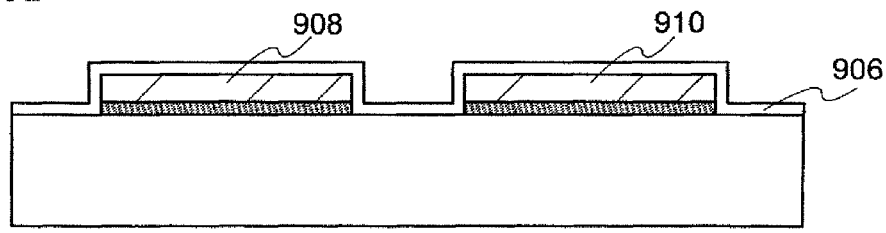
Figure 9C:
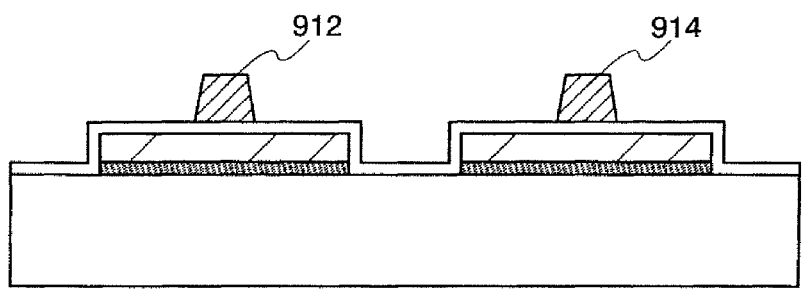
Figure 9D:
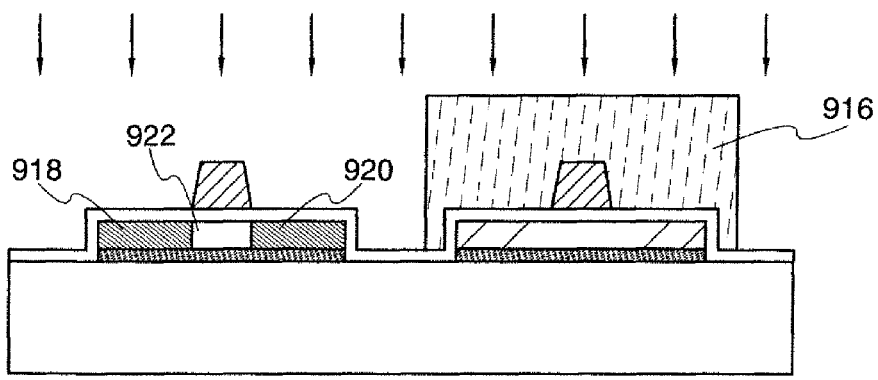

Next, a gate insulating layer 906 which covers the island-shaped single crystal semiconductor layers is formed (see FIG. 9B). Note that for convenience, the island-shaped single crystal semiconductor layers which are formed by patterning are referred to as a single crystal semiconductor layer 908 and a single crystal semiconductor layer 910.

The gate insulating layer 906 is formed of an insulating film containing silicon by a plasma CVD method, a sputtering method, or the like to a thickness of approximately 10 to 150 nm. Specifically, the gate insulating layer 906 may be formed using an oxide or nitride material of silicon typified by silicon nitride, silicon oxide, silicon oxynitride, or silicon nitride oxide. Not that the gate insulating layer 906 may have a single-layer structure or a layered structure. Further, a thin silicon oxide film with a thickness of 1 to 100 nm inclusive, preferably 1 nm to 10 nm inclusive, or more preferably 2 nm to 5 nm inclusive may be formed between the single crystal semiconductor layers and the gate insulating layer. Note that a rare gas element such as argon may be contained in a reaction gas in order to form a gate insulating layer with little leakage current at a low temperature.

Next, a conductive film used for gate electrode layers is formed over the gate insulating layer 906. The thickness of the conductive film may be approximately 50 to 400 nm. Further, the conductive film can be formed by a sputtering method, an evaporation method, a CVD method, or the like. The conductive film may be formed of an element selected from tantalum, tungsten, titanium, molybdenum, aluminum, copper, chromium, neodymium, or the like, an alloy material or a compound material containing the element as its main component, or the like. An AgPdCu alloy, a semiconductor film typified by a polycrystalline silicon film that is doped with an impurity element such as phosphorus, or the like may alternatively be used for the conductive film. Note that although the single-layer structure is described in this embodiment mode, the present invention is not limited thereto, and a layered structure including two or more layers may alternatively be used.

Then, a mask formed of a resist material is formed by a photolithography method and the conductive film is processed into a desired shape using the mask. Accordingly, a gate electrode layer 912 and a gate electrode layer 914 are formed (see FIG. 9C). Note that after formation of the gate electrode layer 912 and the gate electrode layer 914, the above-described mask is removed.

In the processing of the conductive film, etching can be performed to form a desired tapered shape by an ICP (inductively coupled plasma) etching method with appropriate control of the etching conditions (e.g., the amount of power applied to a coiled electrode layer, the amount of power applied to an electrode layer on the substrate side, and the electrode temperature on the substrate side). An angle and the like of the tapered shape can also be controlled by the shape of the mask. Note that as the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Next, a mask 916 formed of a resist material is formed so as to cover the single crystal semiconductor layer 910 by a photolithography method. Then, an impurity element imparting n-type conductivity is added using the gate electrode layer 912 and the mask 916 as masks (see FIG. 9D). Accordingly, an n-type impurity region 918, an n-type impurity region 720, and a channel formation region 722 are formed. In this embodiment mode, doping is performed using phosphine (PH$_3$) as a doping gas containing an impurity element. Here, phosphorus (P) that is an impurity element imparting n-type conductivity is added at a concentration of approximately $1 \times 10^{17}$ to $1 \times 10^{21}$ atoms/cm$^3$, inclusive.

Although not described in this embodiment mode, a so-called LDD (lightly doped drain) region may be provided. By providing the LDD region which overlaps with a gate electrode layer, reduction in on current due to hot carriers can be prevented. Further, by providing an LDD region which does not overlap with a gate electrode layer, an off current can be reduced.

Next, the mask 916 is removed, and a mask 924 which covers the single crystal semiconductor layer 908 is formed. Then, an impurity element imparting p-type conductivity is added using the gate electrode layer 914 and the mask 924 as masks (see FIG. 10A). Accordingly, a p-type impurity region 926, a p-type impurity region 928, and a channel formation region 930 are formed. In this embodiment mode, doping is performed using diborane (B$_2$H$_6$) as a doping gas containing an impurity element. Here, boron (B) that is an impurity element imparting p-type conductivity is added at a concentration of $1\times10^{18}$ to $5\times10^{21}$ atoms/cm$^3$ inclusive. Note that similarly to the above, a so-called LDD region may be provided. After adding the impurity element imparting p-type conductivity, the mask 924 is removed.

Figure 10A:
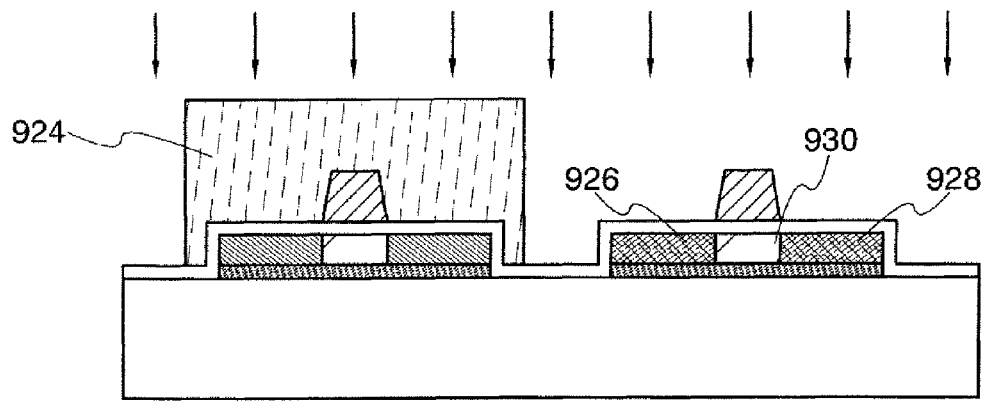
FIGS. 10A to 10C are views illustrating an example of a method for forming a semiconductor device.
Figure 10B:
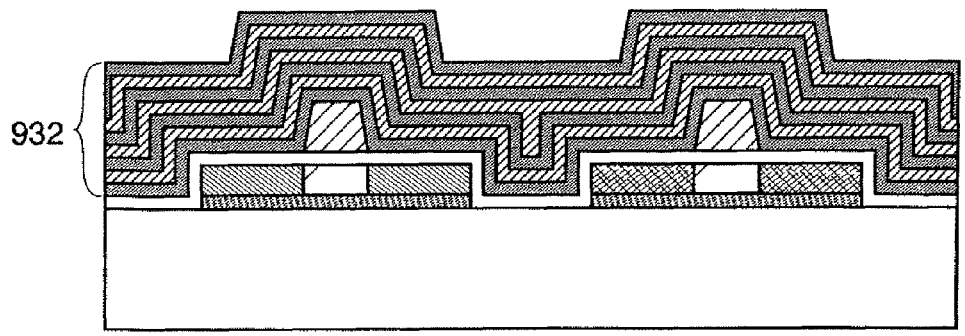
Figure 10C:
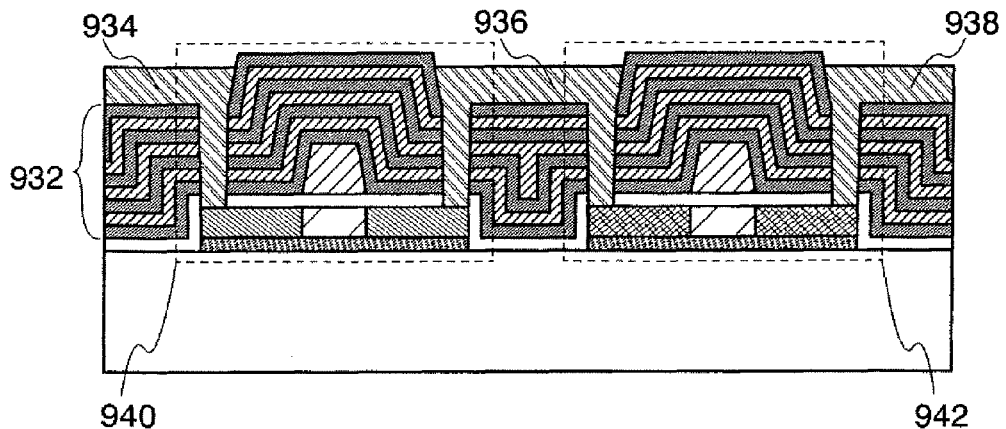

After that, an insulating layer 932 which covers a gate insulating layer 906, a gate electrode layer 912, and a gate electrode layer 914 is formed (see FIG. 10B). The insulating layer 932 can be formed using the materials and the manufacturing method which are described in Embodiment Mode 1. Note that although the insulating layer 932 includes seven regions in this embodiment mode, the present invention is not limited thereto. As described in Embodiment Mode 1, the thickness of each region may be changed as appropriate. The thickness of the insulating layer 932 is preferably from 100 nm to 3 μm, inclusive. In this embodiment mode, the thickness of the insulating layer 932 is 1 μm.

Another insulating layer may be formed before or after the insulating layer 932 is formed. The insulating film 932 can be formed using a material selected from silicon oxide, silicon nitride, silicon oxynitride, silicon nitride oxide, aluminum oxide, aluminum nitride, aluminum oxynitride, aluminum nitride oxide containing more nitrogen than oxygen, diamond-like carbon (DLC), a carbon film containing nitrogen, or other substances containing an inorganic insulating material. Alternatively, a siloxane resin may be used. Note that siloxane resin is a resin including a Si—O—Si bond. Siloxane is composed of a skeleton formed by the bond of silicon (Si) and oxygen (O), in which an organic group containing at least hydrogen (such as an alkyl group or an aryl group) is used as a substituent. A fluoro-group may be included in the organic group. An organic insulating material such as polyimide, acrylic polymer, polyamide, polyimide amide, a benzocyclobutene-based material, or polysilazane can be used.

Next, contact holes (openings) are formed in the gate insulating layer 906, and the insulating layer 932 by using a mask formed of a resist material. Then, a conductive film is formed so as to cover the openings and etched. Thus, a source or drain electrode layer 934, a source or drain electrode layer 936, and a source or drain electrode layer 938 are formed (see FIG. 10C). For the source or drain electrode layers, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, or tin; a compound or alloy material that contains any of the above elements as its component (e.g., indium tin oxide (ITO), indium zinc oxide (IZO), indium tin oxide added with silicon oxide (ITSO), zinc oxide, aluminum-neodymium (Al—Nd), magnesium-silver (MgAg), or the like); a material that is a combination of any of these compounds; or the like can be used. Alternatively, a silicide (e.g., aluminum silicon, molybdenum silicon, or nickel silicide), a compound that contains nitrogen (e.g., titanium nitride, tantalum nitride, or molybdenum nitride), silicon (Si) doped with an impurity element such as phosphorus (P), or the like may be used.

Through the above-described process, a complementary semiconductor device (a so-called CMOS) in which an n-channel transistor 940 and a p-channel transistor 942 are connected through the source or drain electrode layer 936 can be manufactured.

Figure 11A:
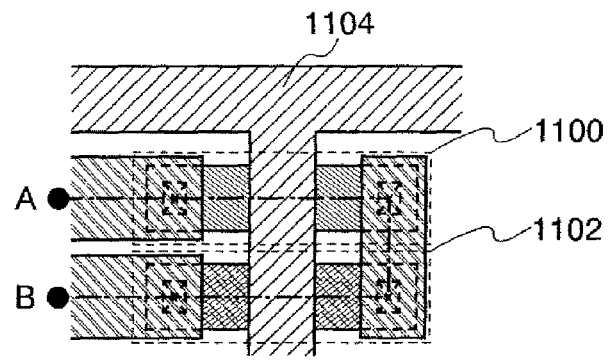
FIGS. 11A and 11C are plan views of a semiconductor device and FIG. 11B is a cross sectional view of the semiconductor device.
Figure 11B:
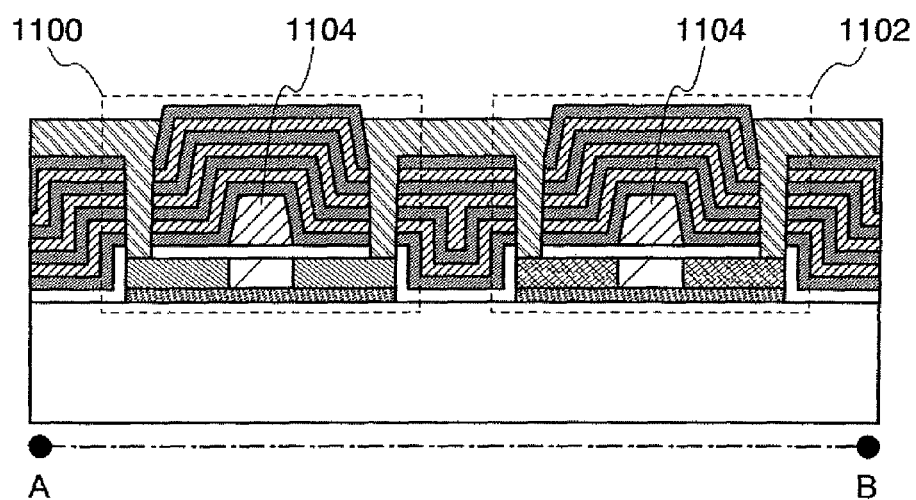
Figure 11C:
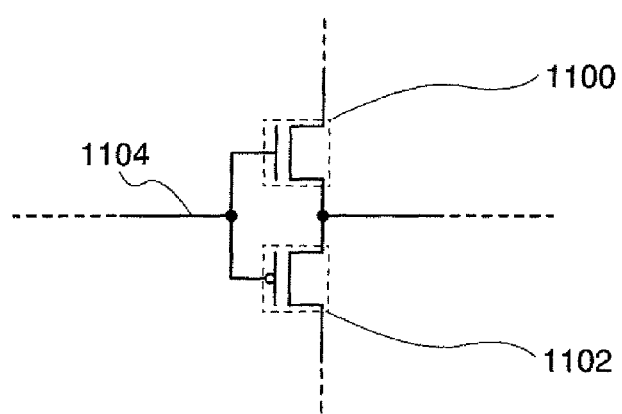

FIGS. 11A to 11C illustrate plan views and a cross-sectional view of a complementary semiconductor device manufactured by the above-described process. FIG. 11A is a plan view of the complementary semiconductor device, and FIG. 11B is a cross-sectional view of the complementary semiconductor device. Here, the cross section taken along line A-B in FIG. 11A corresponds to FIG. 11B. FIG. 11C is a circuit diagram of the complementary semiconductor device. In FIGS. 11A to 11C, an n-channel transistor 1100 and a p-channel transistor 1102 are connected to the same gate electrode 1104 (also referred to as a gate wiring).

The semiconductor device described in this embodiment mode includes an insulating layer having the structure described in Embodiment Mode 1, that is, an insulating layer including a plurality of regions each formed of an insulator containing nitrogen and a plurality of regions each formed of an insulator containing nitrogen and fluorine. Accordingly, the insulator containing nitrogen and fluorine can be efficiently prevented from absorbing moisture and thus, the insulating layer 932 can be prevented from being changed in thickness. Further, reduction in a dielectric strength voltage and mechanical strength can be prevented. That is, reliability of the semiconductor device can be improved. Further, an insulator containing fluorine is included so that the insulating layer 932 whose dielectric constant is low can be obtained. That is, a high-performance semiconductor device in which parasitic capacitance is reduced can be provided. Further, materials having close etching rates are used so that a defect due to etching does not easily occur and reduction in a dielectric strength voltage, or the like can be prevented.

This embodiment mode can be implemented by being combined with Embodiment Mode 1 as appropriate.

Embodiment Mode 3

This embodiment mode will describe an example of a manufacturing method of a liquid crystal display device as an example of a semiconductor device using an insulating layer of the present invention, with reference to FIGS. 12A to 12D, FIGS. 13A to 13C, FIGS. 14A to 14C, and FIGS. 15A and 15B.

First, a single crystal semiconductor layer is formed over a substrate having an insulating surface by the method described in Embodiment Mode 1, or the like (see FIG. 12A). Here, the structure in which an insulating layer 1202 serving as a barrier layer, an insulating layer 1204 serving as a bonding layer, and a single crystal semiconductor layer 1206 are sequentially provided over a substrate 1200 having an insulating surface is described; however, the present invention is not limited thereto. Next, the single crystal semiconductor layer 1206 and the insulating layer 1204 are patterned into a desired shape to form island-shaped single crystal semiconductor layers.

As to an etching process in the patterning, either plasma etching (dry etching) or wet etching may be employed. In the case of processing a large-sized substrate, plasma etching is suitable. As an etching gas, a fluorine-based or chlorine-based gas such as $CF_4$, $NF_3$, $Cl_2$, or $BCl_3$ is used, and an inert gas such as He or Ar may be added as appropriate. In addition, electric discharge may be locally performed when the etching process is performed using atmospheric pressure discharge, and thus a mask layer is not required to be formed over an entire surface of the substrate.

After the single crystal semiconductor layer 1206 and the insulating layer 1204 are patterned, a p-type impurity such as boron, aluminum, or gallium may be added in order to control a threshold voltage. For example, as a p-type impurity, boron can be added at a concentration of $5\times10^{16}$ to $1\times10^{18}$ atoms/cm$^3$ inclusive.

The insulating layer 1202 is formed by stacking a silicon nitride film and a silicon oxide film over the substrate 1200 having an insulating surface. By providing the insulating layer 1202, the single crystal semiconductor layer 1206 can be prevented from being contaminated by movable ions. Note that a silicon nitride oxide film, an aluminum nitride film, or an aluminum nitride oxide film may be applied instead of the silicon nitride film.

Next, a gate insulating layer 1208 which covers the island-shaped single crystal semiconductor layers is formed (see FIG. 12B). Note that for convenience, the island-shaped single crystal semiconductor layers which are formed by patterning are each referred to as single crystal semiconductor layers 1210, 1212, and 1214. The gate insulating layer 1208 is formed of an insulating film containing silicon by a plasma CVD method, a sputtering method, or the like, to a thickness of approximately 10 to 150 nm. Specifically, the gate insulating layer 1208 may be formed from an oxide or nitride material of silicon typified by silicon nitride, silicon oxide, silicon oxynitride, or silicon nitride oxide. Note that the gate insulating layer 1208 may have a single-layer structure or a layered structure. Further, a thin silicon oxide film with a thickness of 1 to 100 nm inclusive, preferably 1 to 10 nm inclusive, and more preferably 2 to 5 nm inclusive, may be formed between the single crystal semiconductor layers and the gate insulating layer. Note that a rare gas element such as argon may be contained in a reactive gas in order to form a gate insulating layer with little leakage current at a low temperature.

Next, a first conductive film and a second conductive film which are used as a gate electrode layer are stacked over the gate insulating layer 1208. The thickness of the first conductive film may be approximately 20 to 100 nm, and the thickness of the second conductive film may be approximately 100 to 400 nm. The first conductive film and the second conductive film can be formed by a sputtering method, an evaporation method, a CVD method, or the like. The first conductive film and the second conductive film may be formed of an element selected from tantalum, tungsten, titanium, molybdenum, aluminum, copper, chromium, or neodymium, an alloy or compound material containing any of the above elements as its main component, or the like. A semiconductor film typified by a polycrystalline silicon film doped with an impurity element such as phosphorus, an AgPdCu alloy, or the like may alternatively be used as the first conductive film and the second conductive film. Note that although the two-layer structure is described in this embodiment mode, the present invention is not limited thereto. Alternatively, a three-layer structure or a single-layer structure may be employed.

Then, a photolithography method is used to form masks 1216a, 1216b, 1216c, 1216d, and 1216e each formed of a resist material. Then, the first conductive film and the second conductive film are processed into a desired shape with the use of the masks to form first gate electrode layers 1218a, 1218b, 1218c, and 1218d, a first conductive layer 1218e, and conductive layers 1220a, 1220b, 1220c, 1220d, and 1220e (see FIG. 12C).

By using an inductively coupled plasma (ICP) etching method and adjusting etching conditions (the amount of power applied to a coiled electrode layer, the amount of power applied to an electrode layer on the substrate side, an electrode temperature on the substrate side, and the like) as appropriate, etching can be performed so as to obtain a desired tapered shape. Further, the taper angle and the like can be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. In this embodiment mode, the second conductive film is etched using an etching gas containing $CF_4$, $Cl_2$, and $O_2$, and the first conductive film is subsequently etched using an etching gas containing $CF_4$ and $Cl_2$.

Next, the conductive layers 1220a, 1220b, 1220c, 1220d and 1220e are processed into a desired shape, using the masks 1216a, 1216b, 1216c, 1216d, and 1216e. At this time, etching is performed under the etching condition in which the selectivity of the second conductive film, which forms the conductive layers, to the first conductive film, which forms the first gate electrode layers and the first conductive layer, is high. By this etching, second gate electrode layers 1222a, 1222b, 1222c, and 1222d, and a second conductive layer 1222e are formed (see FIG. 12D). In this embodiment mode, the second gate electrode layers and the second conductive layer also have tapered shapes, and the respective taper angles are larger than the taper angles of the first gate electrode layers 1218a, 1218b, 1218c, and 1218d and the first conductive layer 1218e. Note that it is assumed that a taper angle is an angle between a bottom surface and a side surface of an object. Thus, when each taper angle is 90°, the conductive layers each have a side surface perpendicular to the bottom surface. When each taper angle is smaller than 90°, coverage of stacked films is improved; thus, defects can be reduced. Note that in this embodiment mode, $Cl_2$, $SF_6$, and $O_2$ are used as an etching gas for forming the second gate electrode layers and the second conductive layer.

Through the above steps, gate electrode layers 1224a and 1224b can be formed in a peripheral driver circuit region 1280, and gate electrode layers 1224c and 1224d and a conductive layer 1224e can be formed in a pixel region 1290 (see FIG. 12D). Note that the masks 1216a, 1216b, 1216c, 1216d, and 1216e are removed after the above steps.

Next, an impurity element imparting n-type conductivity is added using the gate electrode layers 1224a, 1224b, 1224c, and 1224d as masks to form first n-type impurity regions 1226a, 1226b, 1228a, 1228b, 1230a, 1230b, and 1230c (see FIG. 13A). In this embodiment mode, doping is performed using phosphine ($PH_3$) as a doping gas containing an impurity element. Here, phosphorus (P) which is an impurity element imparting n-type conductivity is contained in the first n-type impurity regions at a concentration of approximately $1\times10^{17}$ to $5\times10^{18}$ atoms/cm³.

Next, a mask 1232a, a mask 1232b, and a mask 1232c are formed to cover the single crystal semiconductor layer 1210 and part of the single crystal semiconductor layer 1214. An impurity element imparting n-type conductivity is added using the masks 1232a, 1232b, and 1232c, and the second gate electrode layer 1222b as masks. Accordingly, second n-type impurity regions 1234a and 1234b; third n-type impurity regions 1236a and 1236b; second n-type impurity regions 1240a, 1240b, and 1240c; and third n-type impurity regions 1242a, 1242b, 1242c, and 1242d are formed. In this embodiment mode, doping is performed using phosphine ($PH_3$) as a doping gas containing an impurity element. Here, phosphorus (P) which is an impurity element imparting n-type conductivity is contained in the second n-type impurity regions at a concentration of approximately $1\times10^{17}$ to $1\times10^{21}$ atoms/cm³. The third n-type impurity regions 1236a and 1236b are added with the impurity element imparting n-type conductivity at the same concentration as or at a slightly higher concentration than the third n-type impurity regions 1242a, 1242b, 1242c, and 1242d. In addition, channel formation regions 1238, 1244a, and 1244b are formed (see FIG. 13B).

Each of the second n-type impurity regions is a high concentration impurity region and serves as a source or a drain. On the other hand, each of the third n-type impurity regions is a low concentration impurity region and serves as a so-called LDD (lightly doped drain) region. Each of the third n-type impurity regions 1236a and 1236b is formed in a region overlapped with the first gate electrode layer 1218b. Accordingly, an electric field in the vicinity of a source or a drain can be relieved, and deterioration of an on current due to hot carriers can be prevented. On the other hand, each of the third n-type impurity regions 1242a, 1242b, 1242c, and 1242d is not overlapped with the gate electrode layers 1224c and 1224d; therefore, an effect of reducing an off current can be obtained.

Next, the masks 1232a, 1232b, and 1232c are removed, and masks 1246a and 1246b which cover the single crystal semiconductor layers 1212 and 1214, respectively, are formed. Then, an impurity element imparting p-type conductivity is added using the masks 1246a and 1246b and the gate electrode layer 1224a as masks. Accordingly, first p-type impurity regions 1248a and 1248b, and second p-type impurity regions 1250a and 1250b are formed. In this embodiment mode, doping is performed using diborane ($B_2H_6$) as a doping gas containing an impurity element. Here, boron (B) which is an impurity element imparting p-type conductivity is contained in the first p-type impurity regions and the second p-type impurity regions at a concentration of approximately $1 \times 10^{20}$ to $5 \times 10^{21}$ atoms/cm$^3$. In addition, a channel formation region 1252 is formed (see FIG. 13C).

Each of the first p-type impurity regions is a high concentration impurity region and serves as a source or a drain. On the other hand, each of the second p-type impurity regions is a low concentration impurity region and serves as a so-called LDD (lightly doped drain) region.

After that, the masks 1246a and 1246b are removed. After the masks are removed, an insulating film may be formed so as to cover the side surfaces of the gate electrode layers. The insulating film can be formed by a plasma CVD method or a low-pressure CVD (LPCVD) method. Alternatively, heat treatment, intense light irradiation, laser light irradiation, or the like may be performed in order to activate the impurity elements.

Next, a first interlayer insulating layer which covers the gate electrode layers and the gate insulating layer is formed. In this embodiment mode, an insulating layer 1254 serving as the first interlayer insulating layer is formed using the materials and the manufacturing method which are described in Embodiment Mode 1 (see FIG. 14A). Note that although the insulating layer 1254 includes seven regions in this embodiment mode, the present invention is not limited thereto. As described in Embodiment Mode 1, the thickness of each region may be changed as appropriate. The thickness of the insulating layer 1254 is preferably from 100 nm to 5 μm, inclusive. In this embodiment mode, the thickness of the insulating layer 1254 is 1 μm.

Next, contact holes (openings) reaching the single crystal semiconductor layers and the gate electrode layers are formed in the insulating layer 1254 and the gate insulating layer 1208 by using a mask formed of a resist material. Note that contact holes reaching the gate electrode layers are not shown in the cross section of FIGS. 14A to 14C. Etching related to formation of the contact holes may be performed once or a plurality of times depending on selectivity of a material that is used.

Then, a conductive film is formed so as to cover the openings and etched. Thus, a source or drain electrode layer 1258a, a source or drain electrode layer 1258b, a source or drain electrode layer 1260a, a source or drain electrode layer 1260b, a source or drain electrode layer 1262a, and a source or drain electrode layer 1262a are formed. For the source or drain electrode layers, one or a plurality of elements selected from aluminum, tantalum, titanium, molybdenum, tungsten, neodymium, chromium, nickel, platinum, gold, silver, copper, magnesium, scandium, cobalt, zinc, niobium, silicon, phosphorus, boron, arsenic, gallium, indium, and tin; a compound or alloy material that contains any of the above-mentioned elements as its component (e.g., indium tin oxide (ITO), indium zinc oxide (IZO), indium tin oxide that contains silicon oxide (ITSO), zinc oxide, aluminum-neodymium (Al—Nd), magnesium-silver (MgAg), or the like); a material that is a combination of any of these compounds; or the like can be used. Alternatively, a silicide (e.g., aluminum-silicon, molybdenum-silicon, or nickel silicide), a compound that contains nitrogen (e.g., titanium nitride, tantalum nitride, or molybdenum nitride), silicon (Si) doped with an impurity element such as phosphorus (P) or the like, or the like may be used.

Through the above steps, a p-channel thin film transistor 1264 and an n-channel thin film transistor 1266 are formed in a peripheral driver circuit region 1280, and an n-channel thin film transistor 1268 and a capacitor wiring 1270 are formed in a pixel region 1282 (see FIG. 12B).

Then, an insulating film 1272 is formed as a second interlayer insulating layer. The insulating film 1272 can be formed of a material selected from silicon oxide, silicon nitride, silicon oxynitride, silicon nitride oxide, aluminum oxide, aluminum nitride, aluminum oxynitride, aluminum nitride oxide containing more nitrogen than oxygen, diamond-like carbon (DLC), a carbon film containing nitrogen, phosphosilicate glass (PSG), borophosphosilicate glass (BPSG), an alumina film, polysilazane, or a substance containing an inorganic insulating material. Still alternatively, a siloxane resin may be used. Further alternatively, an organic insulating material such as polyimide, acrylic polymer, polyamide, polyimide amide, or a benzocyclobutene-based material can be used. Note that in this embodiment mode, the layered structure of an insulator containing nitrogen and an insulator containing nitrogen and fluorine is used for the first interlayer insulating layer, and an insulating layer having the layered structure of the present invention may be used as the second interlayer insulating layer.

Next, a contact hole is formed in the insulating film 1272 of the pixel region 1282 to form a pixel electrode layer 1274 (see FIG. 12C). The pixel electrode layer 1274 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, metal such as tungsten, molybdenum, zirconium, hafnium, vanadium, niobium, tantalum, chromium, cobalt, nickel, titanium, platinum, aluminum, copper, or silver, an alloy thereof, or metal nitride thereof.

A conductive composition containing a conductive macromolecule (also referred to as a conductive polymer) may be used as the pixel electrode layer 1274. A thin film of a conductive composition preferably has a sheet resistance of 10000 Ω/square or less. When a thin film of a conductive composition is formed as a pixel electrode layer having a light-transmitting property, light transmittance is preferably 70% or more at a wavelength of 550 nm. Further, the resistivity of a conductive macromolecule which is contained in the thin film of a conductive composition is preferably 0.1 Ω·cm or less.

As the above-described conductive macromolecule, a so-called π electron conjugated conductive macromolecule can be used. For example, polyaniline and a derivative thereof, polypyrrole and a derivative thereof, polythiophene and a derivative thereof, and a copolymer of those materials can be given.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the above-described conductive macromolecules may be used alone. Alternatively, any of the above-described conductive macromolecules can be used with an organic resin added thereto to adjust film characteristics.

An organic resin may be a thermosetting resin, a thermoplastic resin, or a photocurable resin as long as it is compatible to a conductive macromolecule or can be mixed and dispersed into a conductive macromolecule. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as polyvinylidene fluoride, polyvinyl fluoride, polytetrafluoroethylene, ethylene-tetrafluoroethylene copolymer, or polychlorotrifluoroethylene; a vinyl resin such as polyvinyl alcohol, polyvinyl ether polyvinyl butyral, polyvinyl acetate, or polyvinylchloride; an epoxy resin; a xylene resin; an aramid resin; a polyurethane-based resin; a polyurea-based resin, a melamine resin; a phenol-based resin; polyether; an acrylic-based resin, and a copolymer of any of the above resins can be given.

Further, a conductive composition may be doped with an acceptor dopant or a donor dopant, so that the oxidation-reduction potential of a conjugated electron of a conjugated conductive macromolecule may be changed and conductivity of the conductive composition may be adjusted.

As described above, a conductive composition is dissolved in water or an organic solvent (e.g., an alcohol-based solvent, a ketone-based solvent, an ester-based solvent, a hydrocarbon-based solvent, or an aromatic solvent), so that a thin film which serves as the pixel electrode layer 1274 can be formed by an application method, a coating method, a droplet discharge method (also referred to as an ink-jet method), or a printing method, or the like.

Next, an insulating layer 1502 which is referred to as an alignment film is formed so as to cover the pixel electrode layer 1274 and the insulating layer 1272 (see FIG. 10B). The insulating layer 1502 can be formed by a screen printing method or an offset printing method. Note that FIGS. 15A and 15B illustrate a plan view and a cross-sectional view of a semiconductor device, respectively, and FIG. 15A is a plan view of a semiconductor device and FIG. 15B is a cross-sectional view taken along line C-D of FIG. 15A. In the semiconductor device, an external terminal connection region 1276, a sealing region 1278, the peripheral driver circuit region 1280, and the pixel region 1282 are provided.

After the insulating layer 1502 is formed, rubbing treatment is performed. An insulating layer 1506 serving as an alignment film can be formed similarly to the insulating layer 1502.

After that, an counter substrate 1500 and the substrate 1200 having an insulating surface are attached to each other with a sealant 1514 and a spacer 1516 interposed therebetween, and the space is provided with a liquid crystal layer 1504. Note that the counter substrate 1500 is provided with an insulating layer 1506 serving as an alignment film, a conductive layer 1508 serving as a counter electrode, a coloring layer 1510 serving as a color filter, a polarizer 1512 (also referred to as a polarizing plate), and the like. Note that a polarizer 1518 (polarizing plate) is also provided over the substrate 1200 having an insulating surface; however, the present invention is not limited thereto. For example, a polarizer may be provided on one side in a reflective liquid crystal display device.

Subsequently, an FPC 1524 is connected to a terminal electrode layer 1520 which is electrically connected to the pixel region, through an anisotropic conductive layer 1522. The FPC 1524 has a function of transmitting a signal from the external. Through the above steps, a liquid crystal display device can be manufactured.

The liquid crystal display device described in this embodiment mode includes an insulating layer having the structure described in Embodiment Mode 1, that is, an insulating layer including a plurality of regions each formed of an insulator containing nitrogen and a plurality of regions each formed of an insulator containing nitrogen and fluorine. Accordingly, the insulator containing nitrogen and fluorine can be efficiently prevented from absorbing moisture and thus, the thickness thereof can be prevented from being changed. Further, reduction in a dielectric strength voltage and mechanical strength can be prevented. That is, reliability of the semiconductor device can be improved. Further, an insulator containing fluorine is included so that the insulating layer whose dielectric constant is low can be obtained. That is, a high-performance liquid crystal display device in which parasitic capacitance is reduced can be provided. Further, materials having close etching rates are used so that a defect due to etching does not easily occur and reduction in a dielectric strength voltage, or the like can be prevented.

Note that although the method for manufacturing a liquid crystal display device is described in this embodiment mode, the present invention is not limited thereto. Further, although the case of using a layered structure of an insulator containing nitrogen and an insulator containing nitrogen and fluorine for the first interlayer insulating layer, the present invention is not limited thereto. An insulating layer having the layered structure of the present invention may be used as the second interlayer insulating layer, or as the gate insulating layer or any other insulating layer. This embodiment mode can be implemented by being combined with Embodiment Mode 1 or 2 as appropriate.

Embodiment Mode 4

In this embodiment mode, a semiconductor device having a light emitting element according to the present invention (electroluminescent display device) will be described. Note that since it is possible to refer to Embodiment Mode 3 or the like, specific description of a method for manufacturing transistors which are used for a peripheral driver circuit, a pixel region, and the like is omitted.

Note that for a semiconductor device having a light-emitting element, any of bottom emission, top emission, or dual emission can be employed. This embodiment mode will describe a semiconductor device employing bottom emission with reference to FIGS. 16A and 16B; however, the present invention is not limited thereto.

Figure 16A:
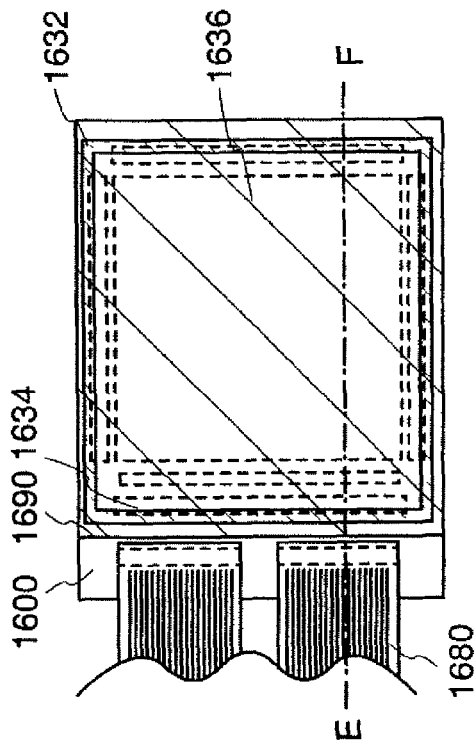
FIGS. 16A and 16B are a plan view and a cross sectional view of a semiconductor device.
Figure 16B:
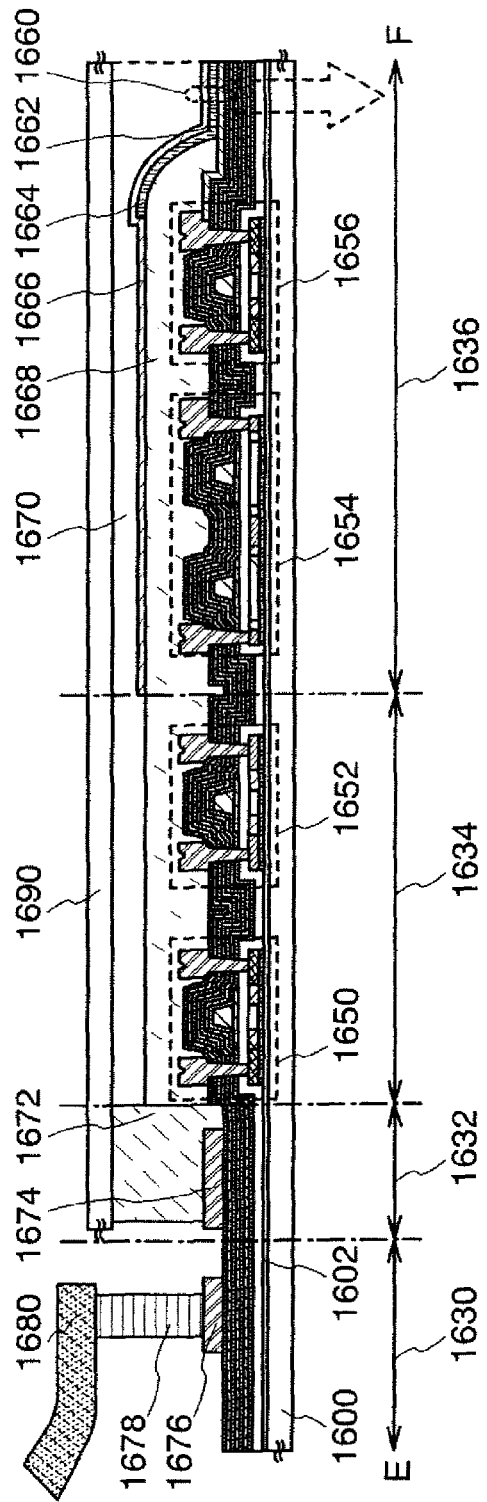

In the semiconductor device illustrated in FIGS. 16A and 16B, light is emitted downwardly (in a direction shown by an arrow). Here, FIG. 16A is a plan view of the semiconductor device, and FIG. 16B is a cross-sectional view taken along line E-F of FIG. 16A. In FIGS. 16A and 16B, the semiconductor device includes an external terminal connection region 1630, a sealing region 1632, a driver circuit region 1634, and a pixel region 1636.

The semiconductor device illustrated in FIGS. 16A and 16B includes a substrate 1600, an insulating film 1602, thin film transistors 1650, 1652, 1654, and 1656, a light-emitting element 1660, an insulating layer 1668, a filler 1670, a sealant 1672, a wiring layer 1674, a terminal electrode layer 1676, an anisotropic conductive layer 1678, an FPC 1680, a sealing substrate 1690, and the like. Note that the light-emitting element 1660 includes a first electrode layer 1662, a light-emitting layer 1664, and a second electrode layer 1666.

As the first electrode layer 1662, a light-transmitting conductive material is used so that light emitted from the light-emitting layer 1664 can be transmitted. On the other hand, as the second electrode layer 1666, a conductive material which can reflect light emitted from the light-emitting layer 1664 is used.

As the first electrode layer 1662, indium oxide containing tungsten oxide, indium zinc oxide containing tungsten oxide, indium oxide containing titanium oxide, indium tin oxide containing titanium oxide, or the like may be used. It is needless to say that indium tin oxide (ITO), indium zinc oxide (IZO), indium tin oxide added with silicon oxide (ITSO), or the like may alternatively be used.

Alternatively, a conductive composition containing a conductive macromolecule (also referred to as a conductive polymer) may be used as the first electrode layer 1662. Note that specific description is omitted because it is possible to refer to Embodiment Mode 3.

As the second electrode layer 1666, a conductive film formed of titanium, tungsten, nickel, gold, platinum, silver, copper, tantalum, molybdenum, aluminum, magnesium, calcium, lithium, or an alloy of any of the above may be used. A substance having high reflectivity in a visible light region is preferred, and an aluminum film is used in this embodiment mode.

Note that in the case of employing each of top emission and dual emission, the design of the electrode layers may be changed as appropriate. Specifically, in the case of top emission, the first electrode layer 1662 is formed using a reflective material, and the second electrode layer 1666 is formed using a light-transmitting material. In the case of dual emission, the first electrode layer 1662 and the second electrode layer 1666 may be formed using a light-transmitting material. Note that in the case of bottom emission and top emission, a structure may be employed in which one electrode layer is formed using a light-transmitting material and the other electrode layer is formed to have a layered structure of a light-transmitting material and a light-reflecting material. The material that can be used for the electrode layers is similar to the material in the case of bottom emission, so the description is omitted.

Note that even such a material as metal without a light-transmitting property can transmit light by being reduced in thickness (approximately 5 to 30 nm). Accordingly, an electrode layer which transmits light may be formed using the above-described light-reflecting material.

The sealing substrate 1690 may be provided with a color filter (a coloring layer). The color filter (a coloring layer) can be formed by an evaporation method or a droplet discharge method. Alternatively, a color conversion layer may be used.

The electroluminescence display device described in this embodiment mode includes an insulating layer having the structure described in Embodiment Mode 1, that is, an insulating layer including a plurality of regions each formed of an insulator containing nitrogen and a plurality of regions each formed of an insulator containing nitrogen and fluorine. Accordingly, the insulator containing nitrogen and fluorine can be efficiently prevented from absorbing moisture and thus, the thickness thereof can be prevented from being changed. Further, reduction in a dielectric strength voltage and mechanical strength can be prevented. That is, reliability of the semiconductor device can be improved. Further, an insulator containing fluorine is included so that the insulating layer whose dielectric constant is low can be obtained. That is, a high-performance electroluminescence display device in which parasitic capacitance is reduced can be provided. Further, materials having close etching rates are used so that a defect due to etching does not easily occur and reduction in a dielectric strength voltage, or the like can be prevented.

Note that although this embodiment mode is described using the electroluminescence display device, the present invention is not limited thereto. This embodiment mode can be implemented by being combined with any of Embodiment Modes 1 to 3 as appropriate.

Embodiment Mode 5

In this embodiment mode, another example of the semiconductor device according to the present invention will be described with reference to FIGS. 17 and 18. Note that although a microprocessor and an electronic tag are taken as examples for description in this embodiment mode, the semiconductor device of the present invention is not limited thereto.

Figure 17:
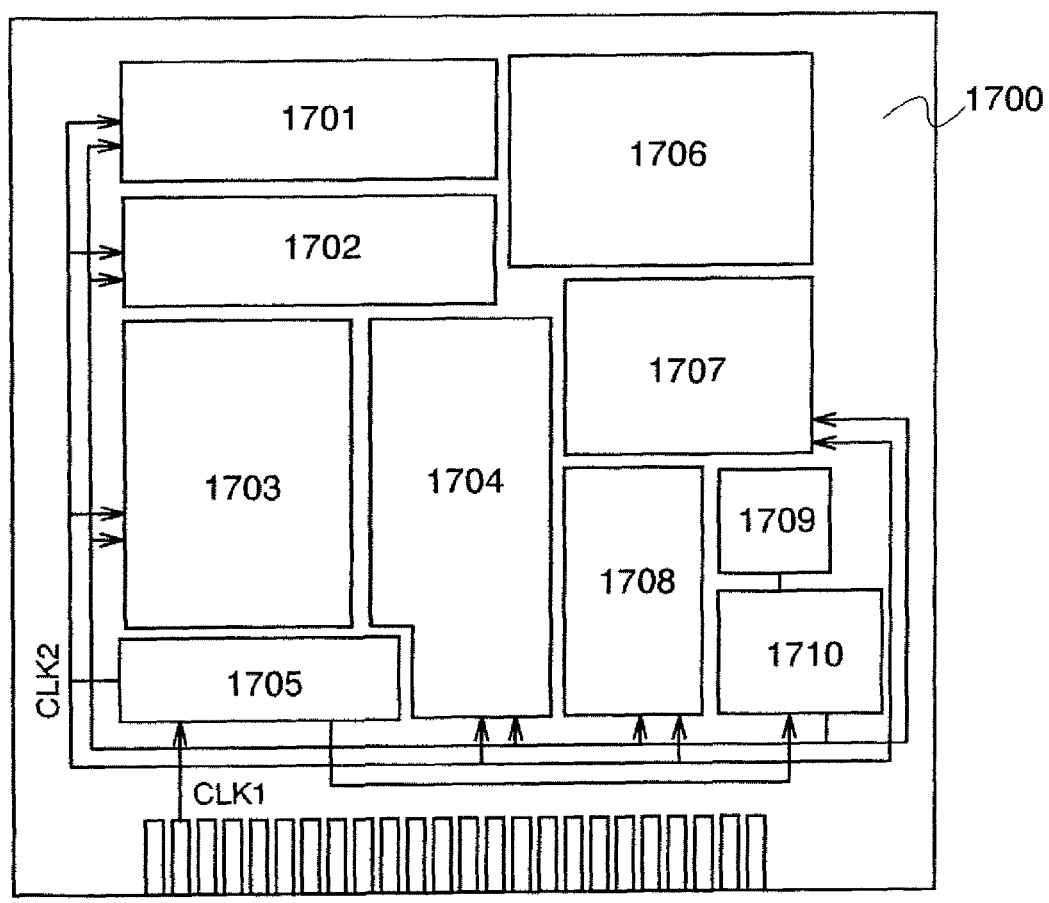
FIG. 17 is a diagram illustrating an example of the structure of a semiconductor device.
Figure 18:
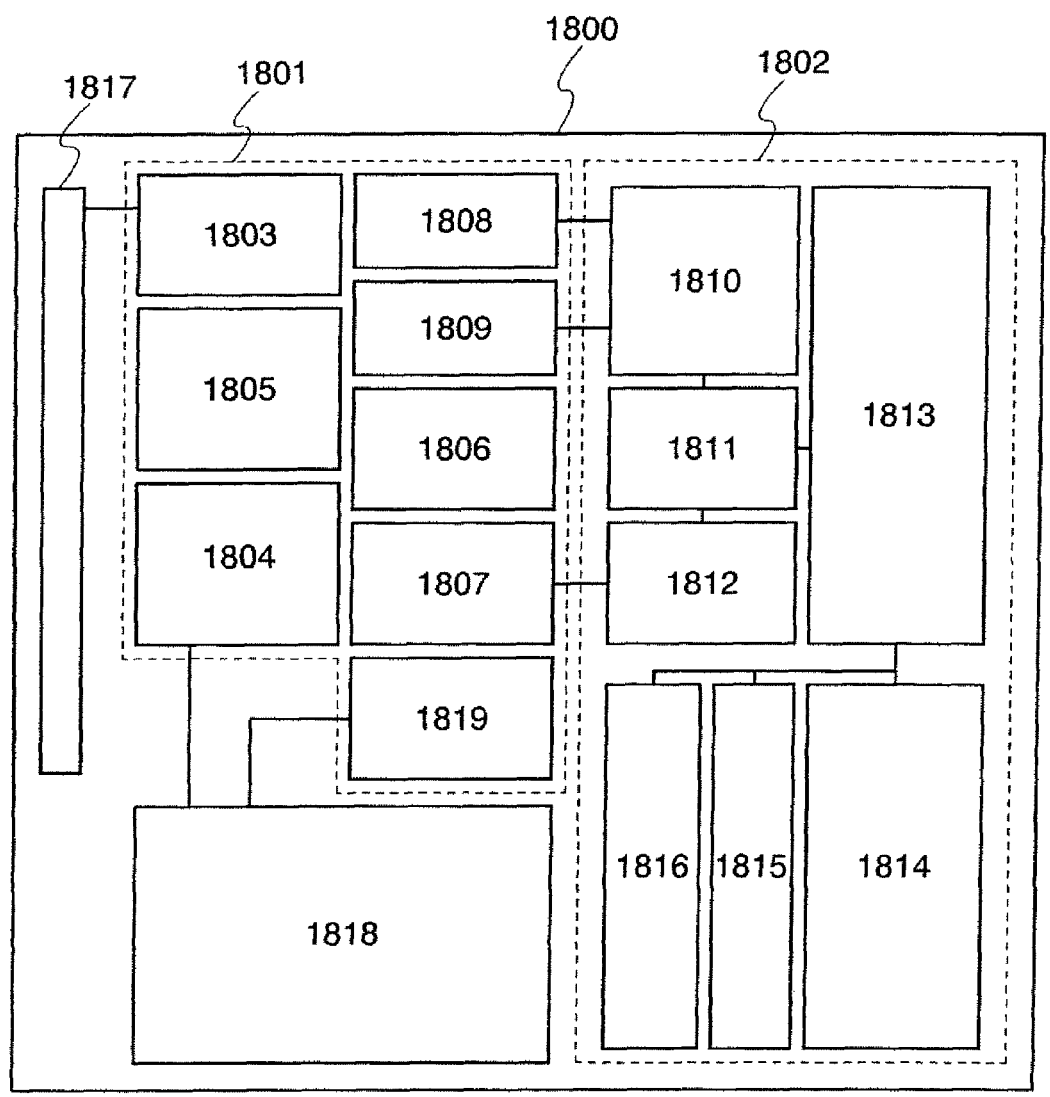
FIG. 18 is a diagram illustrating an example of the structure of a semiconductor device.

FIG. 17 shows an example of the configuration of the microprocessor of the present invention. A microprocessor 1700 in FIG. 17 is manufactured using the semiconductor substrate of the present invention. The microprocessor 1700 has an arithmetic logic unit (ALU) 1701, an arithmetic logic unit controller (ALU controller) 1702, an instruction decoder 1703, an interrupt controller 1704, a timing controller 1705, a register 1706, a register controller 1707, a bus interface (Bus I/F) 1708, a read-only memory (ROM) 1709, and a ROM interface (ROM I/F) 1710.

An instruction input to the microprocessor 1700 through the bus interface 1708 is input to the instruction decoder 1703, decoded therein, and then input to the ALU controller 1702, the interrupt controller 1704, the register controller 1707, and the timing controller 1705. The ALU controller 1702, the interrupt controller 1704, the register controller 1707, and the timing controller 1705 conduct various controls based on the decoded instruction. Specifically, the ALU controller 1702 generates signals for controlling the operation of the ALU 1701. While the microprocessor 1700 is executing a program, the interrupt controller 1704 processes an interrupt request from an external input/output device or a peripheral circuit based on its priority or the like. The register controller 1707 generates an address of the register 1706, and reads and writes data from and to the register 1706 in accordance with the state of the microprocessor 1700. The timing controller 1705 generates signals for controlling timing of operation of the ALU 1701, the ALU controller 1702, the instruction decoder 1703, the interrupt controller 1704, and the register controller 1707. For example, the timing controller 1705 is provided with an internal clock generating portion for generating an internal clock signal CLK2 based on a reference clock signal CLK1, and supplies the internal clock signal CLK2 to the above various circuits. It is to be noted that the microprocessor 1700 illustrated in FIG. 17 is only an example, and an actual microprocessor may have various configurations depending on the uses.

The microprocessor in this embodiment mode includes an insulating layer including a plurality of regions each formed of an insulator containing nitrogen and a plurality of regions each formed of an insulator containing nitrogen and fluorine. Accordingly, the thickness of the insulating layer can be prevented from being changed and reduction in a dielectric strength voltage and mechanical strength can be prevented. That is, the microprocessor with high reliability can be provided. Further, an insulator containing fluorine is included so that the insulating layer whose dielectric constant is low can be obtained. That is, the high-performance microprocessor in which parasitic capacitance is reduced can be provided.

As described above, by using the present invention, a microprocessor whose reliability and performance are improved can be provided.

Next, as an example of a semiconductor device having an arithmetic function, which can transmit and receive data without contact, is described with reference to FIG. 18. FIG. 18 shows an example of a wireless tag that operates to transmit and receive signals to and from an external device by wireless communication. Note that the wireless tag of the present invention incorporates a central processing unit (CPU) and is regarded as a small computer. A wireless tag 1800 includes an analog circuit portion 1801 and a digital circuit portion 1802. The analog circuit portion 1801 includes a resonance circuit 1803 with a resonance capacitor, a rectifier circuit 1804, a constant voltage circuit 1805, a reset circuit 1806, an oscillator circuit 1807, a demodulation circuit 1808, and a modulation circuit 1809. The digital circuit portion 1802 includes an RF interface 1810, a control register 1811, a clock controller 1812, a CPU interface 1813, a CPU 1814, a RAM 1815, and a ROM 1816.

The operation of the wireless tag 1800 having such a configuration is as follows. The resonance circuit 1803 generates an induced electromotive force based on a signal received by an antenna 1817 from the external. A capacitor portion 1818 is charged by the induced electromotive force through the rectifier circuit 1804. The capacitor portion 1818 is preferably formed using a capacitor such as a ceramic capacitor or an electric double layer capacitor. The capacitor portion 1818 may be integrated with the wireless tag 1800 or mounted as a different component on a substrate having an insulating surface which is included in the wireless tag 1800.

The reset circuit 1806 generates a signal for resetting to initialize the digital circuit portion 1802. For example, the reset circuit 1806 generates a signal which rises after rise in the power supply voltage with delay as a reset signal. The oscillator circuit 1807 changes the frequency and duty ratio of a clock signal in response to a control signal generated by the constant voltage circuit 1805. The demodulation circuit 1808 formed using a low-pass filter binarizes, for example, a change in amplitude of an amplitude modulation (ASK) reception signal. The modulation circuit 1809 changes the amplitude of an amplitude modulation (ASK) transmission signal and transmits the signal. The modulation circuit 1809 changes the amplitude of a communication signal by changing a resonance point of the resonance circuit 1803. The clock controller 1812 generates a control signal for changing the frequency and duty ratio of a clock signal in accordance with the power supply voltage or a consumption current of the CPU 1814. The power supply voltage is monitored by a power management circuit 1819.

A signal input from the antenna 1817 to the wireless tag 1800 is demodulated by the demodulation circuit 1808 and then divided into a control command, data, and the like by the RF interface 1810. The control command is stored in the control register 1811. The control command includes an instruction for reading of data stored in the ROM 1816, an instruction for writing of data to the RAM 1815, an arithmetic instruction to the CPU 1814, and the like. The CPU 1814 accesses the ROM 1816, the RAM 1815, and the control register 1811 through the CPU interface 1813. The CPU interface 1813 has a function of generating an access signal for any of the ROM 1816, the RAM 1815, and the control register 1811 based on an address the CPU 1814 requests.

As an arithmetic method of the CPU 1814, a method may be employed in which the ROM 1816 stores an operating system (OS) and a program is read and executed at the time of starting operation. Alternatively, a method may be employed in which an arithmetic circuit is provided and arithmetic processing is conducted using hardware. In a method in which both hardware and software are used, part of processing is conducted by a dedicated arithmetic circuit and the other part of the arithmetic processing is conducted by the CPU 1814 using a program.

The wireless tag in this embodiment mode includes an insulating layer including a plurality of regions each formed of an insulator containing nitrogen and a plurality of regions each formed of an insulator containing nitrogen and fluorine. Accordingly, the thickness of the insulating layer can be prevented from being changed and reduction in a dielectric strength voltage and mechanical strength can be prevented. That is, the wireless tag with high reliability can be provided. Further, an insulator containing fluorine is included so that the insulating layer of which dielectric constant is low can be obtained. That is, the high-performance wireless tag in which parasitic capacitance is reduced can be provided.

As described above, by using the present invention, a wireless tag of which reliability and performance are improved can be provided.

Note that this embodiment mode can be implemented by being combined with any of Embodiment Modes 1 to 4 as appropriate.

Embodiment Mode 6

In this embodiment mode, electronic appliances in each of which a semiconductor device of the present invention, in particular, a display device is used will be described with reference to FIGS. 19A to 19H.

Electronic appliances each manufactured using a semiconductor device of the present invention include cameras such as video cameras and digital cameras, goggle displays (head mounted displays), navigation systems, audio reproducing devices (such as car audios and audio components), computers, game consoles, portable information terminals (such as mobile computers, cellular phones, portable game consoles, and electronic books), image reproducing devices each provided with a recording medium (specifically, a device for reproducing the content of a recording medium such as a digital versatile disc (DVD) and having a display for displaying the reproduced image) and the like.

Figure 19A:
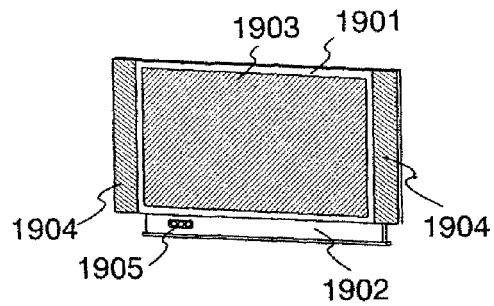
FIGS. 19A to 19H are diagrams each illustrating an electronic appliance using a semiconductor device.

FIG. 19A is a diagram of a television set or a monitor of a personal computer that includes a chassis 1901, a supporting board 1902, a display portion 1903, speaker portions 1904, video input terminals 1905, and the like. The semiconductor device of the present invention is used for the display portion 1903. By the present invention, a television set or a monitor of a personal computer with high reliability and high performance can be provided.

Figure 19B:
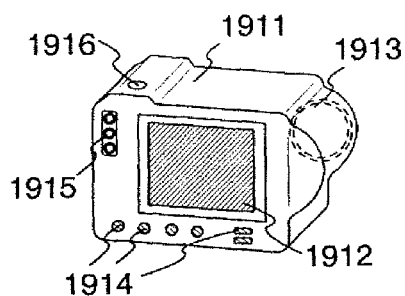

FIG. 19B is a diagram of a digital camera. On the front side part of a main body 1911, an image receiving portion 1913 is provided, and on the top side part of the main body 1911, a shutter button 1916 is provided. Furthermore, on the back side part of the main body 1911, a display portion 1912, operation keys 1914, and an external connection port 1915 are provided. The semiconductor device of the present invention is used for the display portion 1912. By the present invention, a digital camera with high reliability and high performance can be provided.

Figure 19C:
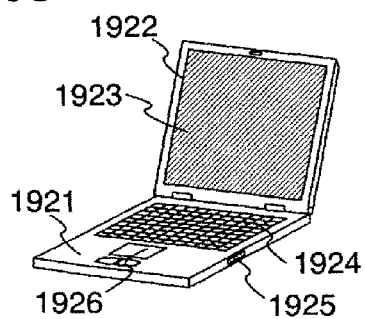

FIG. 19C is a diagram of a laptop computer. In a main body 1921, a keyboard 1924, an external connection port 1925, and a pointing device 1926 are provided. Furthermore, a chassis 1922 that has a display portion 1923 is attached to the main body 1921. The semiconductor device of the present invention is used for the display portion 1923. By the present invention, a laptop computer with high reliability and high performance can be provided.

Figure 19D:
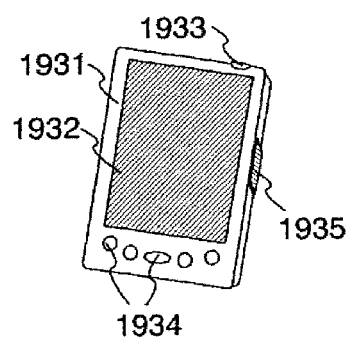

FIG. 19D is a diagram of a mobile computer that includes a main body 1931, a display portion 1932, a switch 1933, operation keys 1934, an infrared port 1935, and the like. Furthermore, an active matrix display device is provided in the display portion 1932. The semiconductor device of the present invention is used for the display portion 1932. By the present invention, a mobile computer with high reliability and high performance can be provided.

Figure 19E:
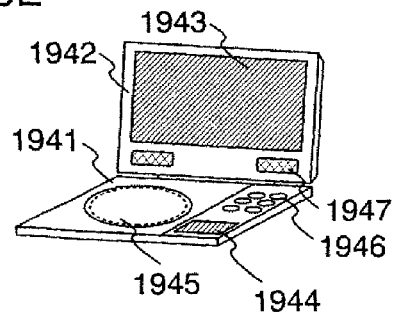

FIG. 19E is a diagram of an image playback device. In a main body 1941, a display portion 1944, a storage media reading portion 1945, and operation keys 1946 are provided. Furthermore, a chassis 1942 that has speaker portions 1947 and a display portion 1943 is attached to the main body 1941. The semiconductor device of the present invention is used for each of the display portion 1943 and the display portion 1944. By the present invention, an image playback device with high reliability and high performance can be provided.

Figure 19F:
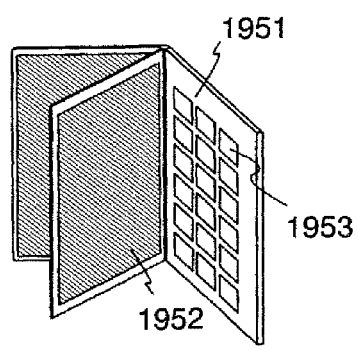

FIG. 19F is a diagram of an electronic book. In a main body 1951, operation keys 1953 are provided. Furthermore, a plurality of display portions 1952 are attached to the main body 1951. The semiconductor device of the present invention is used for each of the display portions 1952. By the present invention, an electronic book with high reliability and high performance can be provided.

Figure 19G:
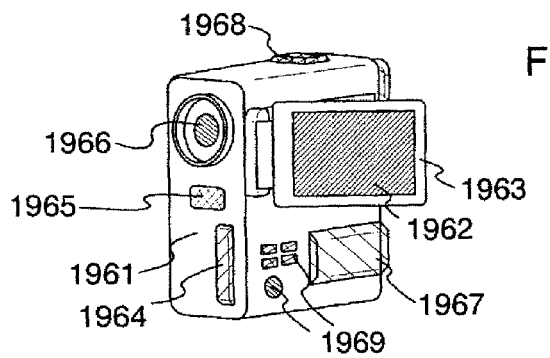

FIG. 19G is a diagram of a video camera. In a main body 1961, an external connection port 1964, a remote control receiving portion 1965, an image receiving portion 1966, a battery 1967, an audio input portion 1968, and operation keys 1969 are provided. Furthermore, a chassis 1963 that has a display portion 1962 is attached to the main body 1961. The semiconductor device of the present invention is used in the display portion 1962. By the present invention, a video camera with high reliability and high performance can be provided.

Figure 19H:
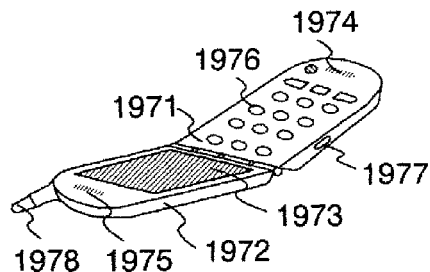
Figure 20A:
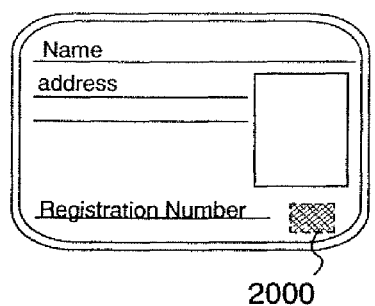
FIGS. 20A to 20F are diagrams illustrating application examples of a semiconductor device.
Figure 20B:
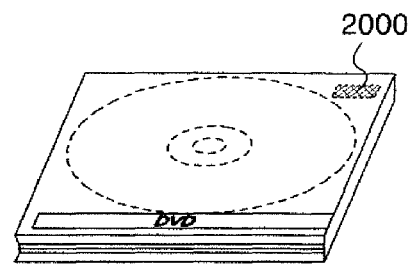
Figure 20C:
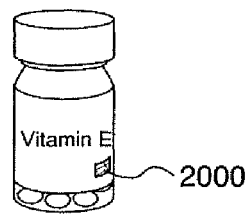
Figure 20D:
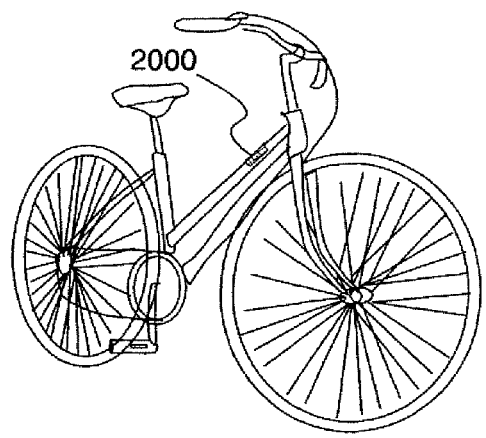
Figure 20E:
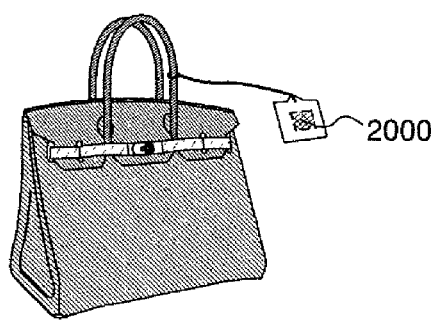
Figure 20F:
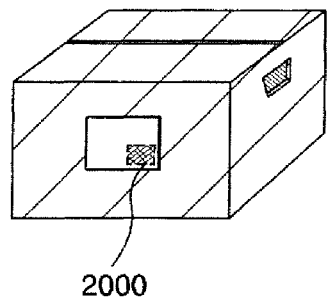

FIG. 19H is a diagram of a cellular phone that includes a main body 1971, a chassis 1972, a display portion 1973, an audio input portion 1974, an audio output portion 1975, operation keys 1976, an external connection port 1977, an antenna 1978, and the like. The semiconductor device of the present invention is used for the display portion 1973. By the present invention, a cellular phone with high reliability and high performance can be provided.

As described above, the application range of the present invention is so wide that the present invention can be applied to electronic appliances of a variety of fields. Note that this embodiment mode can be implemented by being combined with any of Embodiment Modes 1 to 5 as appropriate.

Embodiment Mode 7

In this embodiment mode, application examples of a semiconductor device of the present invention, in particular, a wireless tag will be described with reference to FIGS. 20A to 20F.

According to the present invention, a semiconductor device which serves as a wireless tag can be formed. A wireless tag can be used in a wide variety of applications, and may be used by being mounted on objects such as bills, coins, securities, bearer bonds, and certificates (driver's licenses, resident cards, and the like, see FIG. 20A), containers for wrapping objects (wrapping paper, bottles, and the like, see FIG. 20C), recording media (DVD software, video tapes, and the like, see FIG. 20B), vehicles (bicycles and the like, see FIG. 20D), products such as personal belongings (bags, glasses, and the like), foods, plants, clothes, livingware, and electronic appliances, or shipping tags of baggage (see FIGS. 20E and 20F). Note that the wireless tags are denoted by reference numeral 2000 in FIGS. 20A to 20F.

Note that the electronic appliance refers to objects described in Embodiment Mode 5 as well as a liquid crystal display device, an EL display device, a television unit (also referred to as a TV simply, a TV receiver, or a television receiver), a cellular phone, and the like, for example. In addition, the above-described semiconductor device can be used for animals, human bodies, or the like.

The wireless tag is attached to a surface of an object, or incorporated to be fixed on an object. For example, the wireless tag may be incorporated in paper of a book or an organic resin of a container for wrapping an object to be fixed on each object. By providing the wireless tag in bills, coins, securities, bearer bonds, certificates, and the like, forgery can be prevented. Further, by providing the wireless tag in containers for wrapping objects, recording media, personal belongings, foods, clothes, livingware, electronic appliances, and the like, inspection systems, rental systems, and the like can be performed more efficiently. The wireless tag that can be formed according to the present invention has high performance and high reliability, and can be applied to a variety of objects.

When the wireless tag that can be formed according to the present invention is applied to management system or a distribution system of articles, the system can have high functionality. For example, data recorded in the wireless tag provided in a tag is read by a reader/writer provided near a conveyor belt, so that data on a distribution process or a delivery destination is read out and inspection of merchandise or distribution of goods can be easily carried out.

As described above, the application range of the present invention is extremely wide and the present invention can be applied to a variety of objects. Note that this embodiment mode can be implemented by being combined with any of Embodiment Modes 1 to 6 as appropriate.

Embodiment 1

Figure 21:
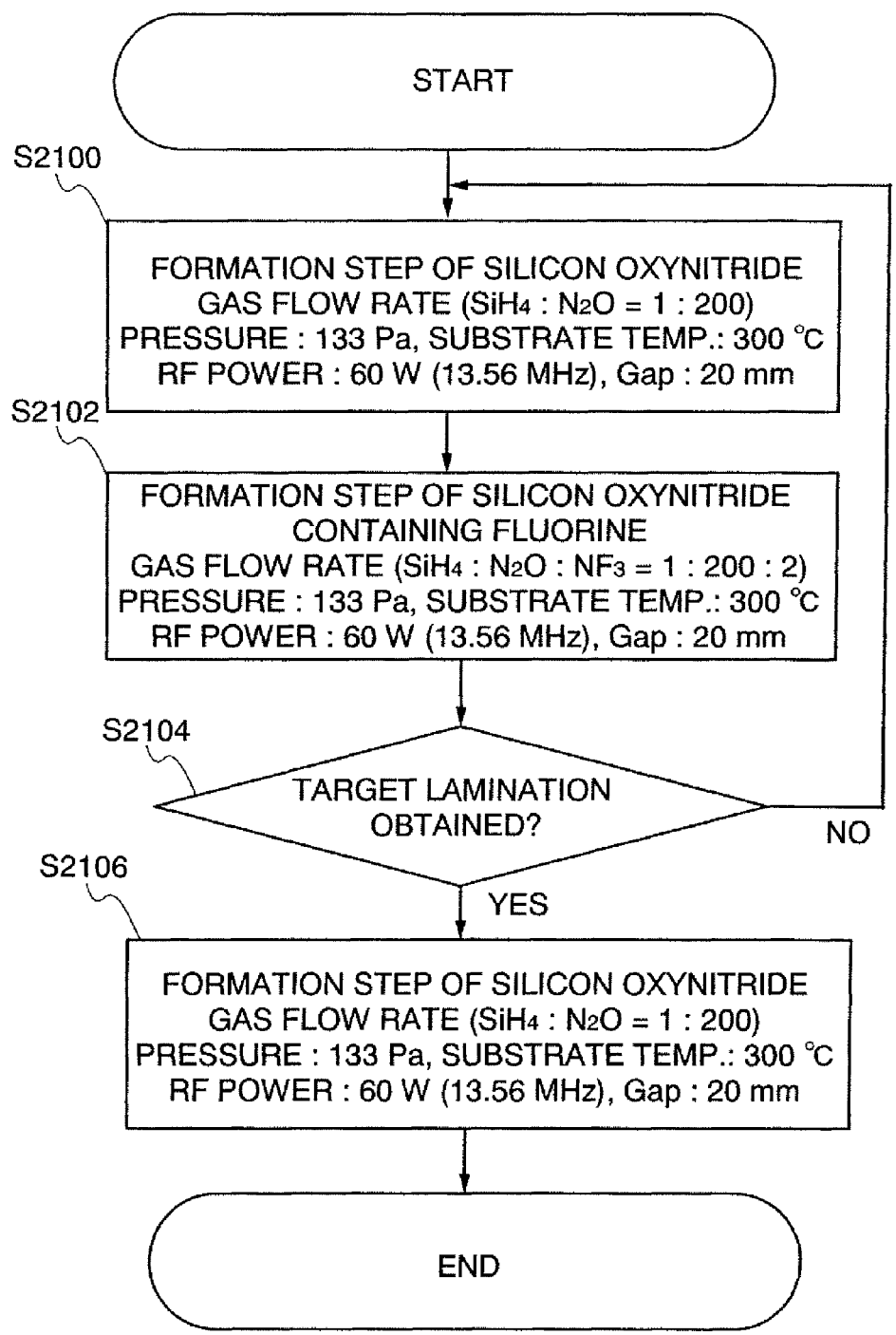
FIG. 21 is a flow chart showing formation of an insulating layer in the embodiment.

In this embodiment, characteristics of an insulating layer of the present invention are described with reference to FIGS. 21 and 22. Note that although the result obtained by investigating an insulating layer including nine regions is described in this embodiment, the present invention is not construed as being limited thereto.

First, the insulating layer including nine regions, which is used in this embodiment, is described. In this embodiment, a "silicon oxynitride film" was formed by a CVD method using monosilane and nitrogen monoxide as source gases and a "silicon oxynitride film containing fluorine" was formed using monosilane, nitrogen monoxide, and nitrogen trifluoride. FIG. 21 is a specific flow chart of film formation.

First, a silicon oxynitride film was formed over a substrate under the following condition: the flow ratio of monosilane and nitrogen monoxide as source gases was 1:200 and a high frequency power source with an output of 60 W and a frequency of 13.56 MHz was used (see S2100). The pressure in a process chamber at the time of formation is 133 Pa, the distance between an upper electrode and a lower electrode was 20 mm, and a substrate temperature was 300° C.

Next, a silicon oxynitride film containing fluorine was formed under the following condition: a flow ratio of monosilane, nitrogen monoxide, and nitrogen trifluoride as source gases was 1:200:2 and a high frequency power source with an output of 60 W and a frequency of 13.56 MHz was used (see S2102). The pressure in a process chamber at the time of formation was 133 Pa, the distance between an upper electrode and a lower electrode was 20 mm, and a substrate temperature was 300° C. That is, it is understood that the formation condition thereof differs from that of the silicon oxynitride film only in that nitrogen trifluoride was added as a source gas.

After that, the above-described process is repeatedly performed until eight regions are formed (see S2104).

The formation condition of the ninth region is similar to that of the first region and the like (see S2106). Thus, the insulating layer in which the uppermost part and the lowermost part are silicon oxynitride films is formed.

The initial thickness and the initial refractive index of the insulating layer including the nine regions, which is formed through the above-described process, are 112.9 nm and 1.47, respectively. In order to observe changes in thickness and refractive index due to moisture absorption, an accelerated test was performed on the insulating layer. In specific, the test was performed at a temperature of 130° C. and a humidity of 85% for eight hours.

Note that an insulating layer formed of silicon oxynitride and an insulating layer formed of silicon oxynitride containing fluorine were prepared as objects to be compared. The initial thicknesses of them were 102.6 nm and 115.5 nm, respectively, and the initial refractive indexes of them were 1.506 and 1.505, respectively.

FIG. 22 shows parameters of the insulating layers before and after the accelerated test. As is evident from FIG. 22, the amount of change in thickness after the accelerated test is as follows: the insulating layer formed of silicon oxynitride containing fluorine>the insulating layer formed of silicon oxynitride>the insulating layer including the nine regions. This tendency is not changed even when the initial thicknesses are taken into consideration. Therefore, it is understood that the insulating layer of the present invention absorbs less moisture and is less easily changed in thickness. Note that the insulating layer of the present invention is also prior to the insulating layer formed of pure silicon oxynitride although details of the cause are unclear. It is understood that the structure including a plurality of regions somehow makes a contribution.

The similar tendency can also be read concerning to the amount of change in refractive index. Note that in the case of comparing the refractive indexes of the insulating layer formed of silicon oxynitride and the insulating layer formed of silicon oxynitride containing fluorine, the refractive indexes seem to be equal; however, it is understood that in the case of taking the thicknesses into consideration, the refractive index of the insulating layer formed of silicon oxynitride containing fluorine is lower than that of the insulating layer formed of silicon oxynitride by approximately 10%. Note that the refractive index is proportional to the square root of the dielectric constant. Further, the refractive indexes of the insulating layer formed of silicon oxynitride and the insulating layer formed of silicon oxynitride containing fluorine are reduced after the accelerated test and it is understood that this is attributed to moisture absorption, which is not favorable in terms of reliability.

Thus, the insulating layer of the present invention has more favorable characteristics than an insulating layer formed of silicon oxynitride, an insulating layer formed of silicon oxynitride containing fluorine, or the like. It is understood that this is attributed to the synergy between a plurality of regions due to adoption of the structure including the plurality of regions.

This embodiment can be implemented by being combined with any of Embodiment Modes 1 to 7 as appropriate.

This application is based on Japanese Patent Application serial no. 2007-271683 filed with Japan Patent Office on Oct. 18, 2007, the entire contents of which are hereby incorporated by reference.

What is claimed is:

1. A method for manufacturing a semiconductor device comprising:
   forming a semiconductor layer over a substrate; and
   alternately forming a first insulator containing nitrogen and a second insulator containing nitrogen and fluorine at least twice, over the semiconductor layer,
   wherein a concentration of fluorine in the second insulator is from $5\times10^{18}$ atoms/cm$^3$ to $1\times10^{21}$ atoms/cm$^3$, inclusive.

2. The method for manufacturing a semiconductor device according to claim 1,
   wherein the first insulator is formed by a plasma CVD method using a gas containing nitrogen, and
   wherein the second insulator is formed by a plasma CVD method using a gas containing nitrogen and a gas containing fluorine.

3. The method for manufacturing a semiconductor device according to claim 2,
   wherein the gas containing fluorine is selectively added to the gas containing nitrogen so that the first insulator and the second insulator are successively formed in a same apparatus.

4. The method for manufacturing a semiconductor device according to claim 1,
   wherein the first insulator is silicon oxynitride or silicon nitride oxide, and
   wherein the second insulator is silicon oxynitride containing fluorine or silicon nitride oxide containing fluorine.

5. The method for manufacturing a semiconductor device according to claim 1,
   wherein the first insulator is formed so as to be an uppermost surface.

6. The method for manufacturing a semiconductor device according to claim 1,
   wherein the first insulators are formed so that thicknesses thereof are increased from a lower part to an upper part.

7. The method for manufacturing a semiconductor device according to claim 1,
   wherein the second insulators are formed so that thicknesses thereof are reduced from a lower part to an upper part.

8. The method for manufacturing a semiconductor device according to claim 1, wherein the first insulator and the second insulator are processed using a dry etching.

9. The method for manufacturing a semiconductor device according to claim 1,
wherein the semiconductor device is one selected from the group consisting of a television set, a camera, a computer, an image playback device, an electronic book, a phone, and a wireless tag.

10. A method for manufacturing a semiconductor device comprising:
forming a semiconductor layer over a substrate; and
alternately forming a first insulator containing nitrogen and a second insulator containing nitrogen and fluorine at least twice, over the semiconductor layer,
wherein the first insulator is formed by a plasma CVD method using a gas containing nitrogen and silicon, and
wherein the second insulator is formed by a plasma CVD method using a gas obtained by adding fluorine to the gas used for forming the first insulator,
wherein the first insulator and the second insulator are successively formed in a same apparatus, and
wherein a concentration of fluorine in the second insulator is from $5 \times 10^{18}$ atoms/cm$^3$ to $1 \times 10^{21}$ atoms/cm$^3$, inclusive.

11. The method for manufacturing a semiconductor device according to claim 10,
wherein the first insulator is silicon oxynitride or silicon nitride oxide, and
wherein the second insulator is silicon oxynitride containing fluorine or silicon nitride oxide containing fluorine.

12. The method for manufacturing a semiconductor device according to claim 10,
wherein the first insulator is formed so as to be an uppermost surface.

13. The method for manufacturing a semiconductor device according to claim 10,
wherein the first insulators are formed so that thicknesses thereof are increased from a lower part to an upper part.

14. The method for manufacturing a semiconductor device according to claim 10,
wherein the second insulators are formed so that thicknesses thereof are reduced from a lower part to an upper part.

15. The method for manufacturing a semiconductor device according to claim 10,
wherein the first insulator and the second insulator are processed using a dry etching.

16. The method for manufacturing a semiconductor device according to claim 10,
wherein the semiconductor device is one selected from the group consisting of a television set, a camera, a computer, an image playback device, an electronic book, a phone, and a wireless tag.

* * * * *